(12) United States Patent
Fujimoto et al.

(10) Patent No.: US 9,277,647 B2
(45) Date of Patent: Mar. 1, 2016

(54) CAPACITOR ELEMENT MOUNTING STRUCTURE AND CAPACITOR ELEMENT MOUNTING METHOD

(71) Applicant: Murata Manufacturing Co., Ltd., Nagaokakyo-shi, Kyoto-fu (JP)

(72) Inventors: Isamu Fujimoto, Nagaokakyo (JP); Kazuo Hattori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 170 days.

(21) Appl. No.: 14/270,403

(22) Filed: May 6, 2014

(65) Prior Publication Data

US 2014/0332261 A1  Nov. 13, 2014

(30) Foreign Application Priority Data

May 10, 2013  (JP) .................. 2013-100588
Feb. 28, 2014  (JP) .................. 2014-038758

(51) Int. Cl.
| | |
|---|---|
| *H05K 1/11* | (2006.01) |
| *H05K 3/34* | (2006.01) |
| *H01G 4/30* | (2006.01) |
| *H01G 4/248* | (2006.01) |

(52) U.S. Cl.
CPC .............. *H05K 1/111* (2013.01); *H01G 4/248* (2013.01); *H01G 4/30* (2013.01); *H05K 3/3442* (2013.01); *H05K 2201/09227* (2013.01); *H05K 2201/10015* (2013.01); *H05K 2201/10522* (2013.01); *H05K 2201/2045* (2013.01); *Y02P 70/611* (2015.11); *Y10T 29/4913* (2015.01)

(58) Field of Classification Search
CPC .......................... H05K 1/111; H05K 3/3442
See application file for complete search history.

(56) References Cited

U.S. PATENT DOCUMENTS

| | | |
|---|---|---|
| 2002/0007908 A1 | 1/2002 | Mamada |
| 2010/0033938 A1 | 2/2010 | Kitagawa et al. |

FOREIGN PATENT DOCUMENTS

| | | |
|---|---|---|
| JP | 2000-232030 A | 8/2000 |
| JP | 2002-232110 A | 8/2002 |
| JP | 2008-294269 A | 12/2008 |
| JP | 2010-45085 A | 2/2010 |

OTHER PUBLICATIONS

Official Communication issued in corresponding Korean Patent Application No. 10-2014-0054733, mailed on Jun. 12, 2015.

*Primary Examiner* — Jeremy C Norris
(74) *Attorney, Agent, or Firm* — Keating & Bennett, LLP

(57) ABSTRACT

A circuit board includes a wiring board on which is mounted first and second laminated ceramic capacitors near or adjacent to each other, arranged along a direction parallel or substantially parallel to a main surface of the wiring board, and electrically connected in series or in parallel via a conductive pattern provided on the wiring board. One width direction side surface of the first laminated ceramic capacitor and one length direction end surface of the second laminated ceramic capacitor oppose each other perpendicularly or approximately perpendicularly.

20 Claims, 24 Drawing Sheets

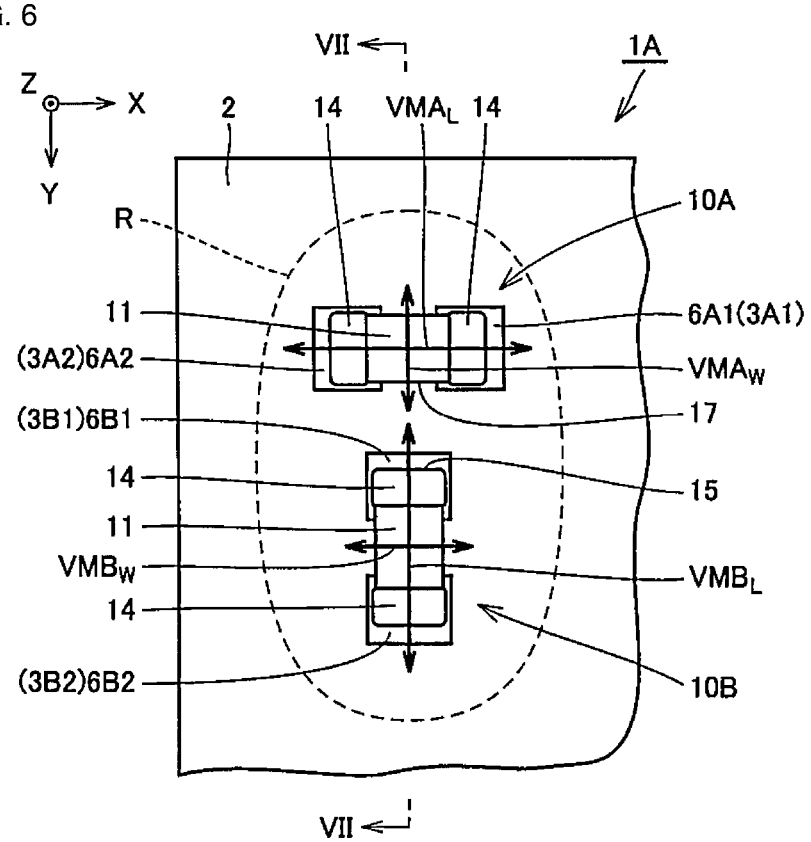

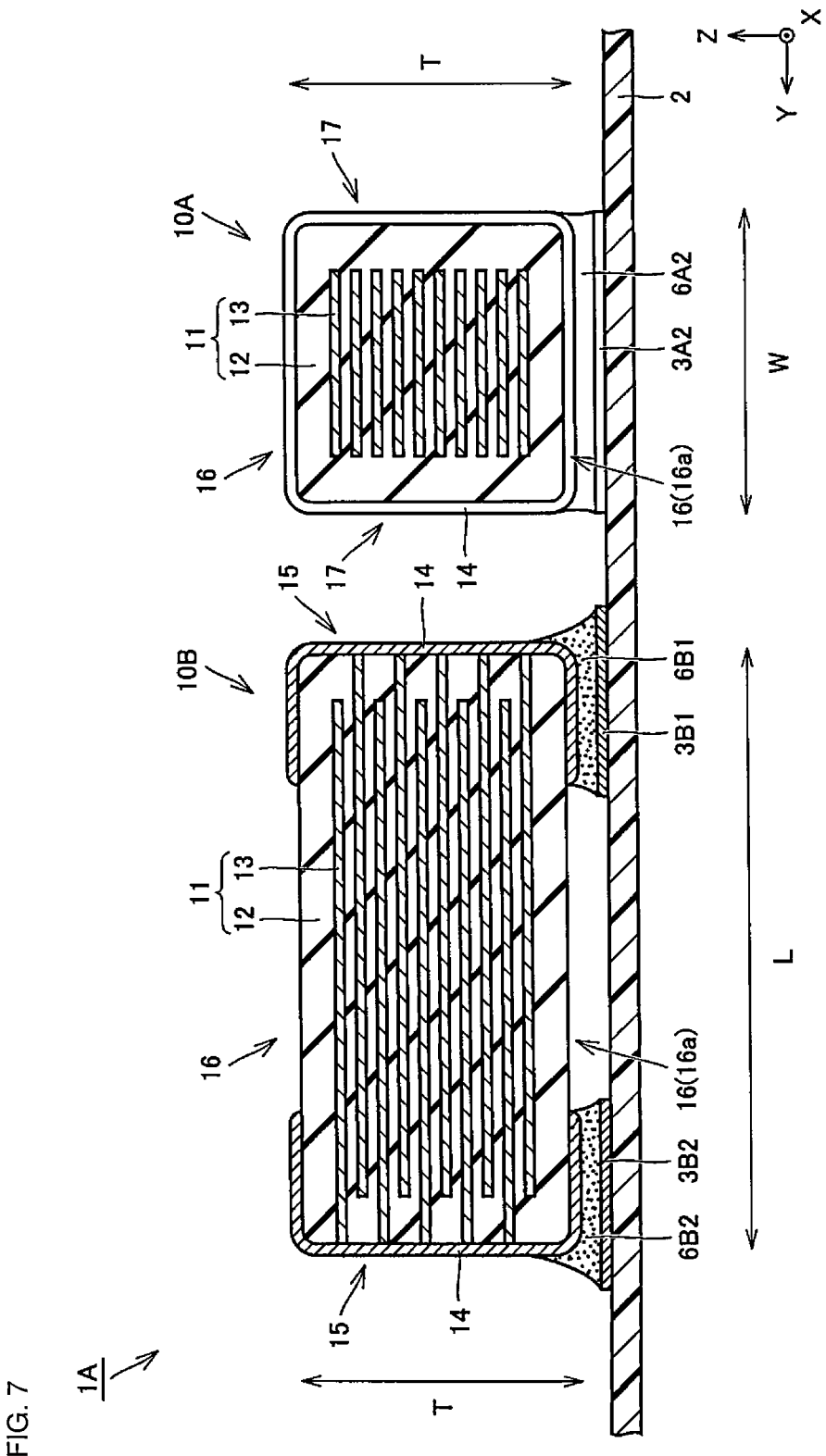

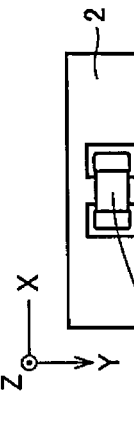
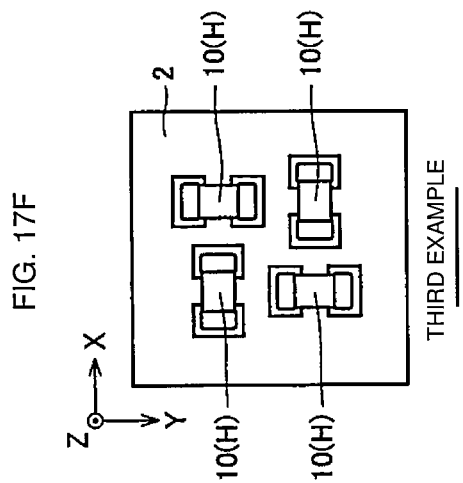
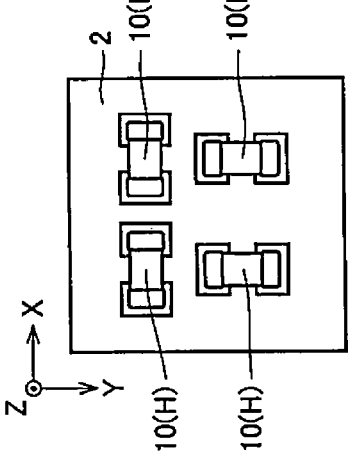
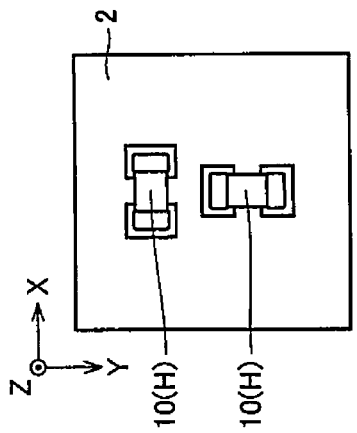

FOURTH COMPARATIVE EXAMPLE

FIFTH COMPARATIVE EXAMPLE

SIXTH COMPARATIVE EXAMPLE

FOURTH EXAMPLE

FIFTH EXAMPLE

SEVENTH COMPARATIVE EXAMPLE

EIGHTH COMPARATIVE EXAMPLE

SIXTH EXAMPLE

CAPACITOR ELEMENT MOUNTING STRUCTURE AND CAPACITOR ELEMENT MOUNTING METHOD

BACKGROUND OF THE INVENTION

1. Field of the Invention

The present invention relates to capacitor element mounting structures in which a plurality of capacitor elements are mounted on a wiring board and capacitor element mounting methods used to mount a plurality of capacitor elements on a wiring board.

2. Description of the Related Art

Recent increases in the capabilities of electronic devices have seen increases in the capacities of laminated ceramic capacitors used as electronic components. A high-permittivity ceramic material such as barium titanate ($BaTiO_3$) is used as a dielectric material in such high-capacity laminated ceramic capacitors.

Such a high-permittivity ceramic material is piezoelectric and electrostrictive, and thus, applying a voltage in a laminated ceramic capacitor that includes a dielectric material configured of a high-permittivity ceramic material produces mechanical distortion.

Accordingly, when an AC voltage or a DC voltage having a superimposed AC component is applied to a high-capacity laminated ceramic capacitor mounted on a wiring board, vibrations are produced due to the mechanical distortion produced in the ceramic material, and the circuit board vibrates as a result of the vibrations being transmitted to the wiring board.

Here, noise referred to as "acoustic noise" is produced in the case where the transmitted vibrations cause the circuit board to vibrate in a frequency range from about 20 Hz to 20 kHz, which corresponds to an audible frequency range.

For example, a DC/DC converter installed in an electronic device converts a DC voltage into a predetermined DC voltage suited for that electronic device and supplies the resulting DC voltage as power, and a laminated ceramic capacitor for decoupling is connected to an input/output circuit of the DC/DC converter in order to reduce noise produced by switching operations. A ripple voltage superimposed on the DC voltage is thus applied to the laminated ceramic capacitor as a result of the switching operations, and the ripple voltage produces mechanical distortion in the laminated ceramic capacitor that has a frequency in the audible frequency range. When this distortion is transmitted to the circuit board, noise is produced in the wiring board.

A variety of techniques have been proposed in order to reduce such noise, such as the technique disclosed in Japanese Unexamined Patent Application Publication No. 2000-232030. The technique disclosed in Japanese Unexamined Patent Application Publication No. 2000-232030 aims to reduce noise by mounting a pair of laminated ceramic capacitors having the same specifications in plane symmetry in corresponding positions on the front and rear surfaces of a wiring board so that vibrations transmitted from one of the laminated ceramic capacitors to the wiring board cancel out vibrations transmitted from the other laminated ceramic capacitor to the wiring board.

Japanese Unexamined Patent Application Publication No. 2002-232110 also discloses a technique for achieving the aforementioned reduction in noise. The technique disclosed in Japanese Unexamined Patent Application Publication No. 2002-232110 aims to reduce noise by mounting a pair of laminated ceramic capacitors near each other on the same main surface of a wiring board so that the long axes thereof are arranged in parallel, where the configuration is such that ripple voltages are applied respectively to the pair of laminated ceramic capacitors to realize an amplitude relationship in which the vibrations in vibration waves transmitted to the wiring board have approximately opposite phases.

However, the technique disclosed in Japanese Unexamined Patent Application Publication No. 2000-232030 can only be applied in the case where the laminated ceramic capacitors can be mounted on the front and rear surfaces of the wiring board, and therefore cannot be applied in the case where the laminated ceramic capacitors can only be mounted on one surface of the wiring board due to the circuitry design of the electronic circuit, the structural design of the electronic device, or the like. There is thus a problem in that there is less freedom with respect to the circuitry design of the electronic circuit and/or the structural design of the electronic device.

There is a further problem in that applying the technique disclosed in Japanese Unexamined Patent Application Publication No. 2000-232030 results in the laminated ceramic capacitors being mounted on the front and rear surfaces of the wiring board, which increases the thickness of the circuit board more than is necessary. This in turn increases the size of the electronic device.

On the other hand, the technique disclosed in Japanese Unexamined Patent Application Publication No. 2002-232110 requires a configuration in which ripple voltages are applied respectively to the pair of laminated ceramic capacitors in order to realize an amplitude relationship in which the vibrations in vibration waves transmitted to the wiring board have approximately opposite phases, resulting in extensive restrictions on the actual mounting layout of electronic components, the circuitry configuration, and so on. Accordingly, there is a problem in that extra space is sometimes necessary on the circuit board in order to realize such a configuration, which can easily lead to an increase in the size of the electronic device.

SUMMARY OF THE INVENTION

Accordingly, preferred embodiments of the present invention provide a capacitor element mounting structure capable of reducing noise while preventing an increase in the size of an electronic device, and provide a capacitor element mounting method capable of preventing an increase in the size of an electronic device and reducing noise.

A capacitor element mounting structure according to a first preferred embodiment of the present invention is a mounting structure including a plurality of rectangular or substantially rectangular parallelepiped capacitor elements mounted on a wiring board, each capacitor element including a multilayer body including dielectric material layers and internal electrode layers layered in an alternating manner along a predetermined direction. The plurality of capacitor elements include a first capacitor element and a second capacitor element, and the first capacitor element and the second capacitor element are disposed near or adjacent to each other and arranged along a direction parallel or substantially parallel to a main surface of the wiring board, and are electrically connected in series or in parallel via a conductive pattern provided on the wiring board. A main surface of the first capacitor element and a main surface of the second capacitor element that oppose the wiring board both preferably have a rectangular or substantially rectangular shape including a pair of short sides and a pair of long sides. The first capacitor element and the second capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body. Here, in the capacitor element mounting structure according to the first preferred embodiment of the present invention, the first capacitor element and the second capacitor element preferably are mounted on the wiring board so that a direction in which the pair of long sides of the main surface on the first capacitor element extend is perpendicular or substantially perpendicular to a direction in which the pair of long sides of the main surface on the second capacitor element extend and one of the pair of side surfaces on the first capacitor element opposes one of the pair of end surfaces on the second capacitor element.

In the capacitor element mounting structure according to the first preferred embodiment of the present invention, it is preferable for each of the first capacitor element and the second capacitor element to include one of the pair of outer electrodes on one of the pair of end surfaces and the other of the pair of outer electrodes on the other of the pair of end surfaces, and in such a case, and it is preferable for each of the outer electrodes to be electrically connected, via a conductive joining member, to a land provided on the wiring board in correspondence with the outer electrode.

In the capacitor element mounting structure according to the first preferred embodiment of the present invention, it is preferable for each of the lands to include a portion that opposes the corresponding outer electrode along a normal direction of the main surface of the wiring board.

In the capacitor element mounting structure according to the first preferred embodiment of the present invention, it is preferable for each of a pair of lands electrically connected to the pair of outer electrodes of the first capacitor element via the joining members to be configured so as to reach outside of a corresponding one of the pair of end surfaces on the first capacitor element in the direction in which the pair of long sides of the main surface of the first capacitor element extend, and for each of a pair of lands electrically connected to the pair of outer electrodes of the second capacitor element via the joining members to be configured so as to reach outside of a corresponding one of the pair of end surfaces on the second capacitor element in the direction in which the pair of long sides of the main surface of the second capacitor element extend.

In the capacitor element mounting structure according to the first preferred embodiment of the present invention, in the case where one of the pair of lands electrically connected to the pair of outer electrodes of the first capacitor element via the joining members is taken as a first land and the other is taken as a second land, a distance between an end portion of the first land on the side opposite from the second land and an end portion of the second land on the side opposite from the first land is taken as D1, and a length of the first capacitor element along a direction in which the pair of long sides of the main surface on the first capacitor element extend is taken as L1, it is preferable for the distance D1 to be no less than about 1.1 times and no more than about 1.3 times the length L1, for example, and in the case where one of the pair of lands electrically connected to the pair of outer electrodes of the second capacitor element via the joining members is taken as a third land and the other is taken as a fourth land, a distance between an end portion of the third land on the side opposite from the fourth land and an end portion of the fourth land on the side opposite from the third land is taken as D2, and a length of the second capacitor element along a direction in which the pair of long sides of the main surface on the second capacitor element extend is taken as L2, it is preferable for the distance D2 to be no less than about 1.1 times and no more than about 1.3 times the length L2, for example.

In the capacitor element mounting structure according to the first preferred embodiment of the present invention, it is preferable for each of the first capacitor element and the second capacitor element to be mounted on the wiring board so that the direction in which the dielectric material layers and the internal electrode layers are layered in the multilayer body is parallel or substantially parallel to the normal direction of the main surface of the wiring board.

It is preferable for the capacitor element mounting structure according to the first preferred embodiment of the present invention to further include an integrated circuit element mounted on the wiring board. In this case, it is preferable for a capacitor element group including the first capacitor element and the second capacitor element and the integrated circuit element to be disposed near or adjacent to each other and arranged along a direction parallel or substantially parallel to the main surface of the wiring board.

A capacitor element mounting structure according to a second preferred embodiment of the present invention is a mounting structure including a plurality of rectangular or substantially rectangular parallelepiped capacitor elements mounted on a wiring board, each capacitor element including a multilayer body including dielectric material layers and internal electrode layers layered in an alternating manner along a predetermined direction. The plurality of capacitor elements include a first capacitor element, a second capacitor element, a third capacitor element, and a fourth capacitor element, and the first capacitor element, the second capacitor element, the third capacitor element, and the fourth capacitor element are disposed near or adjacent to each other and arranged along a direction parallel or substantially parallel to a main surface of the wiring board, and are electrically connected in series or in parallel via a conductive pattern provided on the wiring board. A main surface of the first capacitor element, a main surface of the second capacitor element, a main surface of the third capacitor element, and a main surface of the fourth capacitor element that oppose the wiring board all preferably have a rectangular or substantially rectangular shape including a pair of short sides and a pair of long sides. The first capacitor element, the second capacitor element, the third capacitor element, and the fourth capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body. Here, in the capacitor element mounting structure according to the second preferred embodiment of the present invention, the first capacitor element, the second capacitor element, the third capacitor element, and the fourth capacitor element are mounted on the wiring board so that a direction in which the pair of long sides of the main surface on the first capacitor element extend is perpendicular or substantially perpendicular to a direction in which the pair of long sides of the main surface on the second capacitor element extend, a direction in which the pair of long sides of the main surface on the second capacitor element extend is perpendicular or substantially perpendicular to a direction in which the pair of long sides of the main surface on the third capacitor element extend, a direction in which the pair of long sides of the main surface on the third capacitor element extend is perpendicular or substantially perpendicular to a direction in which the pair of long sides of the main surface on the fourth capacitor element extend, and a direction in which the pair of long sides of the main surface on the fourth capacitor element extend is perpendicular or substantially perpendicular to a direction in which the pair of long sides of the main surface on the first capacitor element extend, and so that one of the pair of side surfaces on the first capacitor element opposes one of the pair of end surfaces on the second capacitor element, one of the pair of side surfaces on the second capacitor element opposes one of the pair of end surfaces on the third capacitor element, one of the pair of side surfaces on the third capacitor element opposes one of the pair of end surfaces on the fourth capacitor element, and one of the pair of side surfaces on the fourth capacitor element opposes one of the pair of end surfaces on the first capacitor element.

It is preferable for the capacitor element mounting structure according to the second preferred embodiment of the present invention to further include an integrated circuit element mounted on the wiring board. In this case, it is preferable for a capacitor element group including the first capacitor element, the second capacitor element, the third capacitor element, and the fourth capacitor element and the integrated circuit element to be disposed near or adjacent to each other and arranged along a direction parallel or substantially parallel to the main surface of the wiring board.

A capacitor element mounting method according to a first preferred embodiment of the present invention is a method for mounting a plurality of rectangular or substantially rectangular parallelepiped capacitor elements on a wiring board, each capacitor element including a multilayer body including dielectric material layers and internal electrode layers layered in an alternating manner along a predetermined direction. The plurality of capacitor elements include a first capacitor element and a second capacitor element, and the first capacitor element and the second capacitor element are disposed near or adjacent to each other and arranged along a direction parallel or substantially parallel to a main surface of the wiring board, and are electrically connected in series or in parallel via a conductive pattern provided on the wiring board. A main surface of the first capacitor element and a main surface of the second capacitor element that oppose the wiring board both preferably have a rectangular or substantially rectangular shape including a pair of short sides and a pair of long sides. The first capacitor element and the second capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body. Here, in the capacitor element mounting method according to the first preferred embodiment of the present invention, the first capacitor element and the second capacitor element are mounted on the wiring board so that a direction in which the pair of long sides of the main surface on the first capacitor element extend is perpendicular or substantially perpendicular to a direction in which the pair of long sides of the main surface on the second capacitor element extend and one of the pair of side surfaces on the first capacitor element opposes one of the pair of end surfaces on the second capacitor element.

A capacitor element mounting method according to a second preferred embodiment of the present invention is a method for mounting a plurality of rectangular or substantially rectangular parallelepiped capacitor elements on a wiring board, each capacitor element including a multilayer body including dielectric material layers and internal electrode layers layered in an alternating manner along a predetermined direction. The plurality of capacitor elements include a first capacitor element, a second capacitor element, a third capacitor element, and a fourth capacitor element, and the first capacitor element, the second capacitor element, the third capacitor element, and the fourth capacitor element are disposed near or adjacent to each other and arranged along a direction parallel or substantially parallel to a main surface of the wiring board, and are electrically connected in series or in parallel via a conductive pattern provided on the wiring board. A main surface of the first capacitor element, a main surface of the second capacitor element, a main surface of the third capacitor element, and a main surface of the fourth capacitor element that oppose the wiring board are all preferably rectangular or substantially rectangular and include a pair of short sides and a pair of long sides. The first capacitor element, the second capacitor element, the third capacitor element, and the fourth capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body. Here, in the capacitor element mounting method according to the second preferred embodiment of the present invention, the first capacitor element, the second capacitor element, the third capacitor element, and the fourth capacitor element are mounted on the wiring board so that a direction in which the pair of long sides of the main surface on the first capacitor element extend is perpendicular or substantially perpendicular to a direction in which the pair of long sides of the main surface on the second capacitor element extend, the direction in which the pair of long sides of the main surface on the second capacitor element extend is perpendicular or substantially perpendicular to a direction in which the pair of long sides of the main surface on the third capacitor element extend, the direction in which the pair of long sides of the main surface on the third capacitor element extend is perpendicular or substantially perpendicular to a direction in which the pair of long sides of the main surface on the fourth capacitor element extend, and the direction in which the pair of long sides of the main surface on the fourth capacitor element extend is perpendicular or substantially perpendicular to the direction in which the pair of long sides of the main surface on the first capacitor element extend, and so that one of the pair of side surfaces on the first capacitor element opposes one of the pair of end surfaces on the second capacitor element, one of the pair of side surfaces on the second capacitor element opposes one of the pair of end surfaces on the third capacitor element, one of the pair of side surfaces on the third capacitor element opposes one of the pair of end surfaces on the fourth capacitor element, and one of the pair of side surfaces on the fourth capacitor element opposes one of the pair of end surfaces on the first capacitor element.

Here, the term "substantially rectangular parallelepiped capacitor element" as used above includes elements whose corner areas and ridge areas are rounded, elements in which steps, non-planarities, and the like of a size that can generally be ignored are provided in the surface thereof, and so on.

In addition, the term "substantially rectangular main surface" as used above includes surfaces in which the contour lines of corner areas are rounded, surfaces in which bends, curvatures, and the like of a size that can generally be ignored are provided in the sides of the contour lines, and so on.

In addition, a direction being "perpendicular or substantially perpendicular" to another direction as used above includes not only the case where an angle defined by the two directions is 90°, but also the case where the degree shifts away from 90° due to variation in the orientation of the capacitor elements that can occur during mounting, and specifically the case where the angle defined by the two directions is no less than about 80° and no more than about 100°, for example.

Furthermore, a direction being "parallel or substantially parallel" to another direction as used above includes not only the case where the two directions are perfectly parallel, but also the case where the state shifts away from being perfectly parallel due to variation in the orientation of the capacitor elements that can occur during mounting, and specifically the case where the lower of the angles defined by the directions is greater than about 0° and no more than about 10°, for example.

According to various preferred embodiments of the present invention, a capacitor element mounting structure capable of reducing noise while preventing an increase in the size of an electronic device is provided, and furthermore, a capacitor element mounting method capable of reducing a noise while preventing an increase in the size of an electronic device is also provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a schematic plan view illustrating a layout of laminated ceramic capacitors provided on a circuit board according to the first configuration example.

FIG. 7 is a cross-sectional view of the circuit board shown in FIGS. 5 and 6, taken along a VII-VII line shown in FIG. 6.

FIGS. 17A to 17F are diagrams illustrating mounting layouts for the laminated ceramic capacitors according to first to third comparative examples and first to third examples verified in a first verification test.

DETAILED DESCRIPTION OF THE PREFERRED EMBODIMENTS

Figure 1:
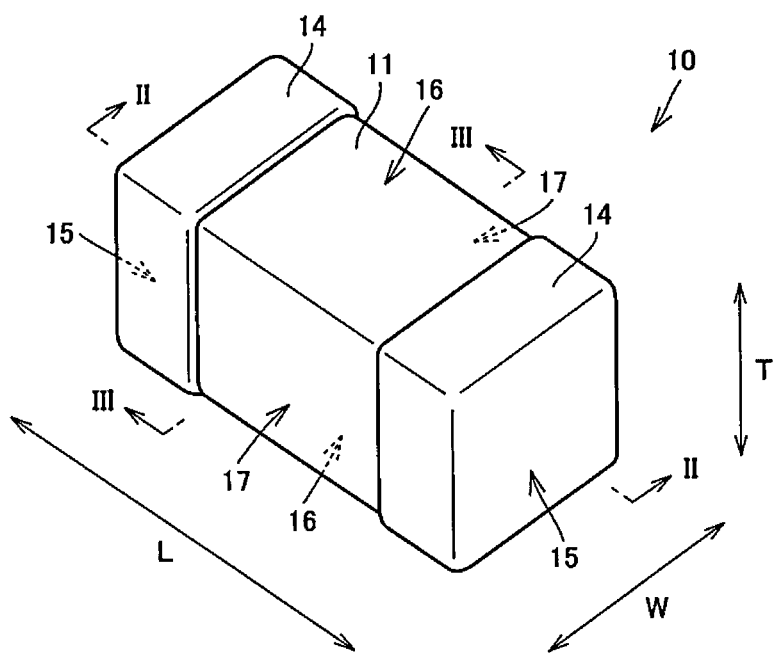
FIG. 1 is a perspective view illustrating a laminated ceramic capacitor provided on a circuit board according to a preferred embodiment of the present invention.

Hereinafter, preferred embodiments of the present invention will be described in detail with reference to the drawings. Note that in the following preferred embodiments, identical reference numerals are assigned to identical or common elements in the drawings, and descriptions thereof will be omitted.

The following preferred embodiments describe a circuit board configured by mounting a capacitor element on a wiring board as an example of a capacitor element mounting structure. Furthermore, although a laminated ceramic capacitor that uses a ceramic material as a dielectric material, a laminated metalized film capacitor that uses a resinous film as a dielectric material, and so on can be given as examples of the capacitor element applied in the present invention and mounted on the wiring board, the following preferred embodiments describe the laminated ceramic capacitor as non-limiting examples.

Figure 2:
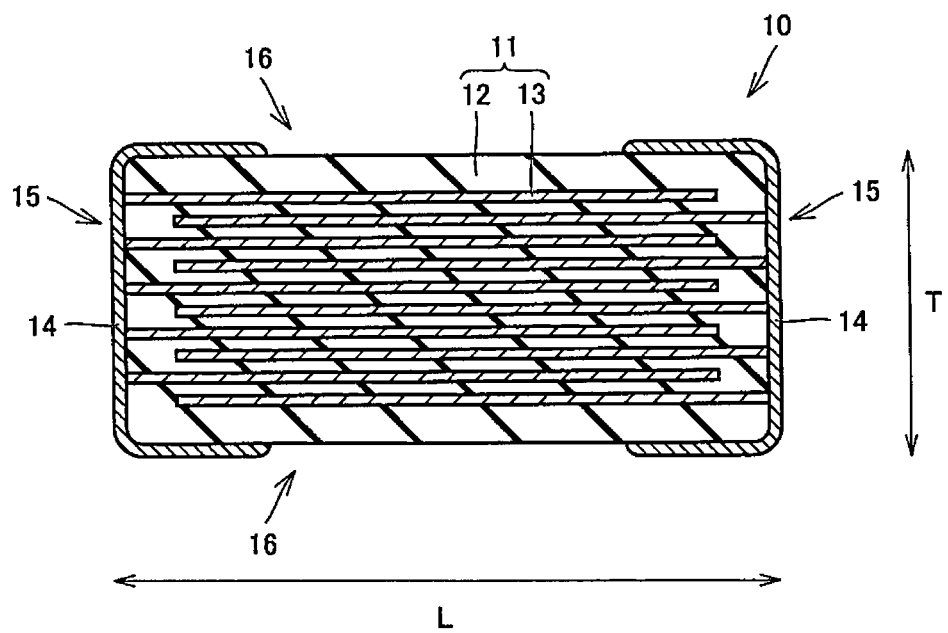
FIG. 2 is a cross-sectional view of the laminated ceramic capacitor shown in FIG. 1, taken along a II-II line shown in FIG. 1.
Figure 3:
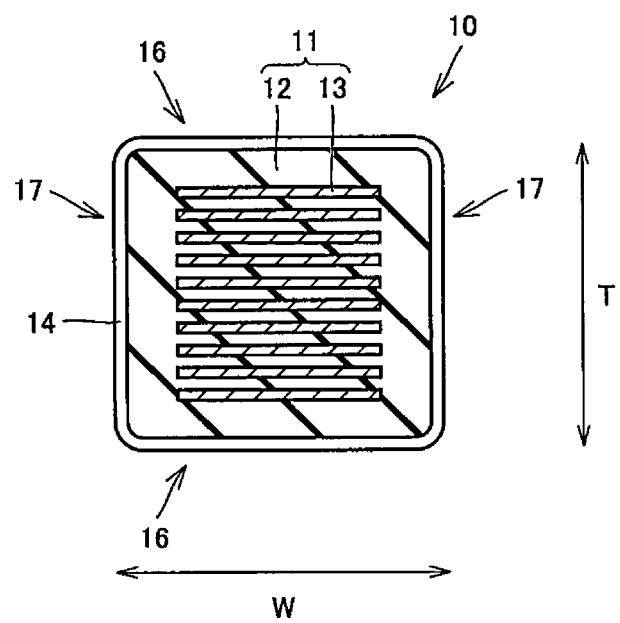
FIG. 3 is a cross-sectional view of the laminated ceramic capacitor shown in FIG. 1, taken along a III-III line shown in FIG. 1.

FIG. 1 is a perspective view illustrating a laminated ceramic capacitor provided on a circuit board according to a preferred embodiment of the present invention. FIG. 2 is a cross-sectional view of the laminated ceramic capacitor shown in FIG. 1, taken along a II-II line shown in FIG. 1, and FIG. 3 is a cross-sectional view of the laminated ceramic capacitor shown in FIG. 1, taken along a III-III line shown in FIG. 1. First, the laminated ceramic capacitor provided on the circuit board in the present preferred embodiment will be described with reference to FIGS. 1 to 3.

As shown in FIGS. 1 to 3, a laminated ceramic capacitor 10 preferably is an electronic component having an overall rectangular or substantially rectangular parallelepiped shape, and includes a multilayer body 11 and a pair of outer electrodes 14.

As shown in FIGS. 2 and 3, the multilayer body 11 includes dielectric material layers 12 and inner electrode layers 13 that are layered in an alternating manner along a predetermined direction. The dielectric material layers 12 are preferably formed from a ceramic material that includes barium titanate, for example, as a main component. The dielectric material layers 12 may include a Mn compound, a Mg compound, a Si compound, a Co compound, a Ni compound, a rare earth compound, or the like as secondary components in a ceramic powder that serves as the raw material of a ceramic sheet, which will be described later. Meanwhile, the inner electrode layers 13 are formed of a metal material such as Ni, Cu, Ag, Pd, an Ag—Pd alloy, Au, or the like.

The multilayer body 11 is manufactured preferably by preparing a plurality of raw material sheets in which a conductive paste that will serve as the inner electrode layers 13 is printed onto the surface of a ceramic sheet ("green sheet") that will serve as the dielectric material layers 12, layering the plurality of raw material sheets, and then press-bonding and sintering the sheets.

Note that the material of the dielectric material layers 12 is not limited to the aforementioned ceramic material that includes barium titanate as a main component, and another high-permittivity ceramic material (a material that takes $CaTiO_3$, $SrTiO_3$, or the like as a main component) may be selected as the material for the dielectric material layers 12. Likewise, the material of the inner electrode layers 13 is not limited to the aforementioned metal material, and another conductive material may be selected as the material of the inner electrode layers 13.

As shown in FIGS. 1 and 2, the pair of outer electrodes 14 are provided at a distance from each other in a predetermined direction so as to cover the outer surface of both end portions of the multilayer body 11. The pair of outer electrodes 14 are configured of conductive films.

The pair of outer electrodes 14 are configured of a layered film including a sintered metal layer and a plating layer, for example. The sintered metal layer is formed by baking a paste such as Cu, Ni, Ag, Pd, an Ag—Pd alloy, Au, or the like. The plating layer is configured of a Ni plating layer and a Sn plating layer that covers the Ni plating layer, for example. The plating layer may be a Cu plating layer, an Au plating layer, or the like instead. In addition, the pair of outer electrodes 14 may be configured of only a plating layer, for example.

Furthermore, a conductive resin paste can also be used for the pair of outer electrodes 14. Because resin components contained in a conductive resin paste provide an effect of absorbing vibrations produced in the multilayer body 11, using a conductive resin paste for the pair of outer electrodes 14 makes it possible to effectively dampen vibrations transmitted from the multilayer body 11 to the exterior, which is useful for reducing noise.

As shown in FIG. 2, one of a pair of inner electrode layers 13 that are adjacent to each other in a layering direction with the dielectric material layers 12 interposed therebetween is electrically connected to one of the pair of outer electrodes 14 inside the laminated ceramic capacitor 10, and the other of the pair of inner electrode layers 13 that are adjacent to each other in the layering direction with the dielectric material layer 12 interposed therebetween is electrically connected to the other of the pair of outer electrodes 14 inside the laminated ceramic capacitor 10. Accordingly, a plurality of capacitor elements are electrically connected in parallel between the pair of outer electrodes 14.

Here, when a direction in which the pair of outer electrodes 14 are arranged is defined as a length direction L of the laminated ceramic capacitor 10, a direction in which the dielectric material layers 12 and the inner electrode layers 13 are layered in the multilayer body 11 is defined as a thickness direction T, and a direction perpendicular or substantially perpendicular to both the length direction L and the thickness direction T is defined as a width direction W as shown in FIGS. 1 to 3, the laminated ceramic capacitor 10 according to the present preferred embodiment has a long, narrow, rectangular or substantially rectangular parallelepiped shape in which an outer dimension that follows the length direction L is the longest dimension.

Note that about 3.2 mm×about 1.6 mm, about 2.0 mm×about 1.25 mm, about 1.6 mm×about 0.8 mm, about 1.0 mm×about 0.5 mm, about 0.8 mm×about 0.4 mm, about 0.6 mm×about 0.3 mm, about 0.4 mm×about 0.2 mm, and so on can be given as representative values for the outer dimensions of the laminated ceramic capacitor 10 in the length direction L and the width direction W, respectively (the outer dimension in the thickness direction T is normally the same as the outer dimension in the width direction W).

Furthermore, of the six main surfaces of the rectangular or substantially rectangular parallelepiped laminated ceramic capacitor 10, a pair of main surfaces located opposite to each other in the length direction L are defined as length direction end surfaces 15, a pair of main surfaces located opposite to each other in the thickness direction T are defined as thickness direction side surfaces 16, and a pair of main surfaces located opposite to each other in the width direction W are defined as width direction side surfaces 17; these terms will be used in the following descriptions.

Figure 4:
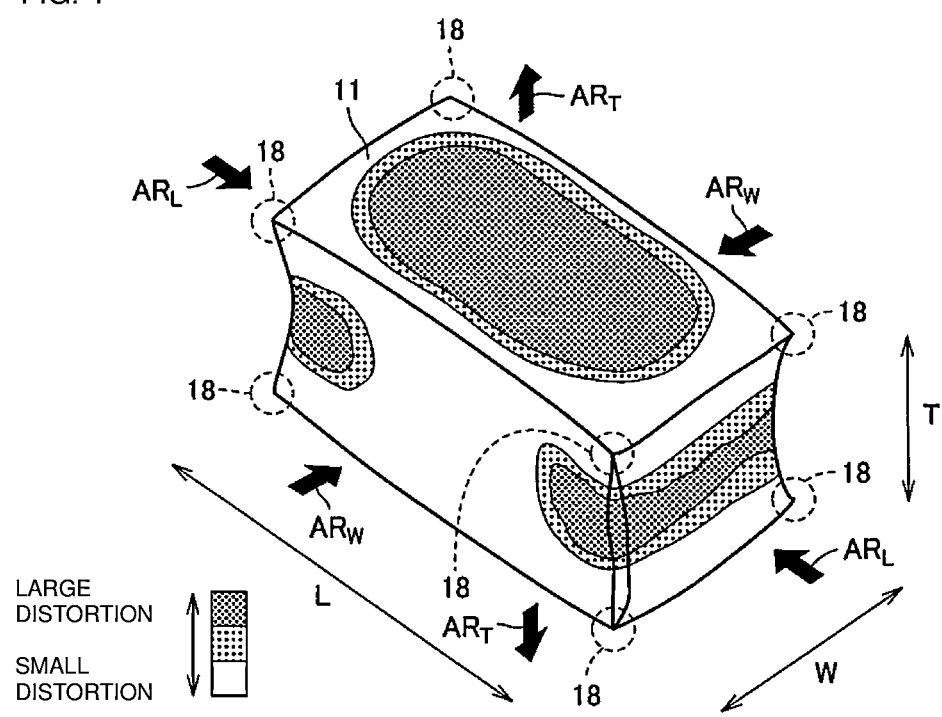
FIG. 4 is a diagram illustrating a result of simulating distortion produced when a voltage is applied to a multilayer body in the laminated ceramic capacitor shown in FIG. 1.

FIG. 4 is a diagram illustrating a result of simulating distortion produced when a voltage is applied to a multilayer body in the laminated ceramic capacitor shown in FIG. 1. Next, the distortion that can be produced in the laminated ceramic capacitor provided on the circuit board according to the present preferred embodiment will be described with reference to FIG. 4.

When an AC voltage or a DC voltage having a superimposed AC component is applied to the pair of outer electrodes 14 of the laminated ceramic capacitor 10, mechanical distortion is produced in the multilayer body 11 as shown in FIG. 4, resulting in distortion of the laminated ceramic capacitor 10.

As shown in FIG. 4, when the voltage is applied, the multilayer body 11 distorts extensively outward along the thickness direction T, as indicated by an arrow $AR_T$ in FIG. 4. As a result, the multilayer body 11 distorts significantly inward along the length direction L, as indicated by an arrow $AR_L$ in FIG. 4, and also distorts inward along the width direction W, as indicated by an arrow $AR_W$ in FIG. 4. However, almost no distortion is produced at corner portions 18 of the long, narrow, rectangular or substantially rectangular parallelepiped multilayer body 11.

Accordingly, similar distortion is also produced in the laminated ceramic capacitor 10 when a voltage is applied thereto, resulting in the distortion described above being produced repeatedly in accordance with the period of the voltage applied to the laminated ceramic capacitor 10. As a result, the laminated ceramic capacitor 10 acts as a source of vibrations in a circuit board provided with the laminated ceramic capacitor 10, and when those vibrations are transmitted to the wiring board, the circuit board vibrates as a result, which in turn produces noise.

A circuit board and a laminated ceramic capacitor mounting method according to the present preferred embodiment achieves a reduction in noise while preventing an increase in the size of the circuit board by focusing on a laminated ceramic capacitor group including a plurality of specific laminated ceramic capacitors among a plurality of laminated ceramic capacitors mounted on a wiring board and applying a characteristic layout to mounting positions of the plurality of laminated ceramic capacitors included in the laminated ceramic capacitor group.

First Configuration Example

Figure 5:
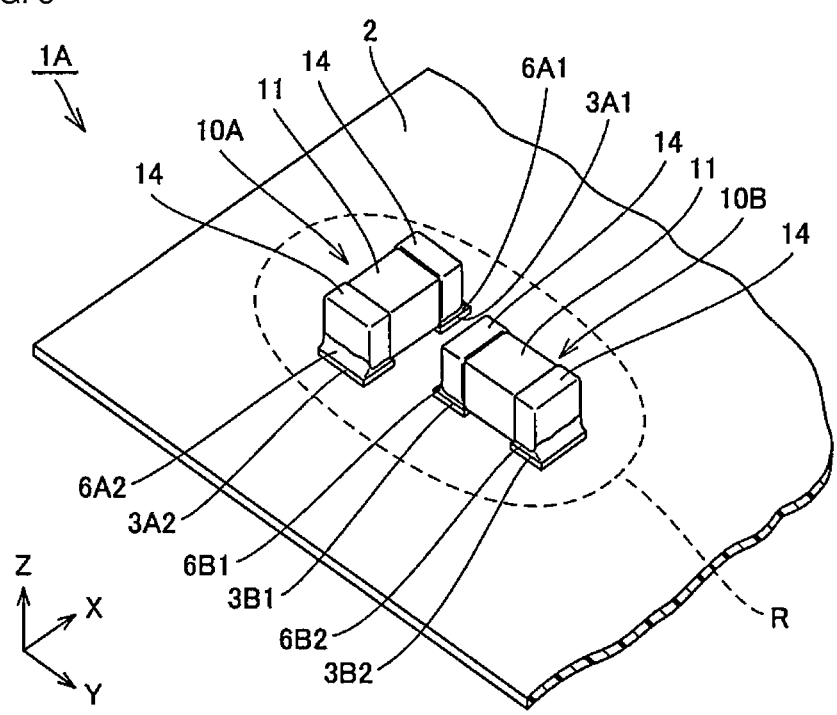
FIG. 5 is a general perspective view illustrating a layout of laminated ceramic capacitors provided on a circuit board according to a first configuration example.
Figure 8A:
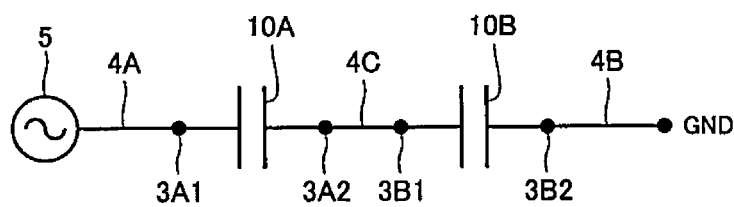
FIGS. 8A and 8B are diagrams illustrating an example of the configuration of a circuit including the laminated ceramic capacitors illustrated in FIGS. 5 and 6.
Figure 8B:
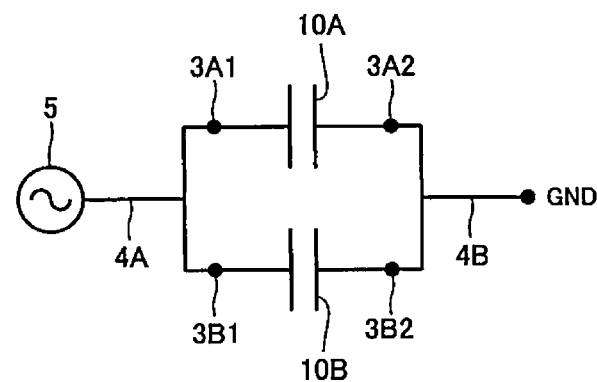

FIGS. 5 and 6 are a general perspective view and a schematic plan view illustrating a layout of laminated ceramic capacitors provided on a circuit board according to a first configuration example based on the present preferred embodiment. FIG. 7, meanwhile, is a cross-sectional view of the circuit board shown in FIGS. 5 and 6, taken along a VII-VII line shown in FIG. 6, and FIGS. 8A and 8B are diagrams illustrating an example of the configuration of a circuit including the laminated ceramic capacitors illustrated in FIGS. 5 and 6.

The present first configuration example focuses on a pair of laminated ceramic capacitors that have the same design specifications (the same capacities and the same sizes) and are electrically connected in series or in parallel via a conductive pattern provided on a wiring board, as the plurality of laminated ceramic capacitors included in the aforementioned laminated ceramic capacitor group.

As shown in FIGS. 5 to 7, a circuit board 1A includes a wiring board 2 as well as a first laminated ceramic capacitor 10A and a second laminated ceramic capacitor 10B that serve as the aforementioned pair of laminated ceramic capacitors. The first laminated ceramic capacitor 10A and the second laminated ceramic capacitor 10B both have the structure illustrated in FIGS. 1 to 3.

The wiring board 2 is made of an insulative substrate having a conductive pattern provided on at least one of the pair of main surfaces thereof. A resinous material such as an epoxy resin, a ceramic material such as alumina, or a material in which a filler, a woven fabric, or the like made of an inorganic material or an organic material is added to the materials can be used as the material of the wiring board 2. Generally speaking, it is preferable to use a glass epoxy substrate, in which a woven fabric made of glass is added to a substrate made of an epoxy resin, as the wiring board 2.

A pair of lands 3A1 and 3A2 corresponding to the first laminated ceramic capacitor 10A and a pair of lands 3B1 and 3B2 corresponding to the second laminated ceramic capacitor 10B are provided on the main surface of the wiring board 2. The lands 3A1, 3A2, 3B1, and 3B2 respectively correspond to portions of the aforementioned conductive pattern, and are disposed in positions so as to be separated from each other.

The lands 3A1, 3A2, 3B1, and 3B2 each preferably have sizes that correspond to the pairs of outer electrodes 14 in the first laminated ceramic capacitor 10A and the second laminated ceramic capacitor 10B, respectively, and cover areas opposing the corresponding outer electrodes 14 along a normal direction of the main surface of the wiring board 2 (a Z axis direction, in the drawings). Although various types of conductive materials can be used as the material for the lands 3A1, 3A2, 3B1, and 3B2, it is generally preferable to use a metal material such as copper foil or the like.

The respective pairs of outer electrodes 14 in the first laminated ceramic capacitor 10A and the second laminated ceramic capacitor 10B are joined to the corresponding lands 3A1, 3A2, 3B1, and 3B2 provided on the wiring board 2 by conductive joining members 6A1, 6A2, 6B1, and 6B2. A conductive adhesive, solder, or the like can be used for the joining members 6A1, 6A2, 6B1, and 6B2. Here, in the case where a conductive adhesive is used for the joining members 6A1, 6A2, 6B1, and 6B2, a resinous component contained in the conductive adhesive provides an effect of absorbing vibrations produced in the first laminated ceramic capacitor 10A and the second laminated ceramic capacitor 10B, which makes it possible to effectively dampen vibrations transmitted from the first laminated ceramic capacitor 10A and the second laminated ceramic capacitor 10B to the exterior and is thus useful for reducing noise.

When mounting the first laminated ceramic capacitor 10A and the second laminated ceramic capacitor 10B on the wiring board 2, the conductive adhesive or solder is applied in advance to the tops of the lands 3A1, 3A2, 3B1, and 3B2 provided on the wiring board 2 through screen printing or the like, after which the first laminated ceramic capacitor 10A and the second laminated ceramic capacitor 10B are placed thereupon and loaded into a reflow oven. As a result, fillets are formed on the joining members 6A1, 6A2, 6B1, and 6B2 and the first laminated ceramic capacitor 10A and the second laminated ceramic capacitor 10B are mounted on the wiring board 2.

As described above, the first laminated ceramic capacitor 10A and the second laminated ceramic capacitor 10B are electrically connected in series or in parallel through the conductive pattern provided on the wiring board 2. To be more specific, as shown in FIGS. 8A and 8B, the first laminated ceramic capacitor 10A and the second laminated ceramic capacitor 10B are electrically connected to each other in series or in parallel via the lands 3A1, 3A2, 3B1, and 3B2 and interconnects 4A to 4C that serve as the conductive pattern provided on the wiring board 2, and are also electrically connected to the same power source 5 as well as to a ground terminal GND. In other words, the first laminated ceramic capacitor 10A and the second laminated ceramic capacitor 10B are connected in parallel or in series to the same power source line.

The circuit configuration illustrated in FIG. 8A corresponds to a case where the first laminated ceramic capacitor 10A and the second laminated ceramic capacitor 10B are electrically connected in series. In this case, one of the pair of outer electrodes 14 in the first laminated ceramic capacitor 10A and one of the pair of outer electrodes 14 in the second laminated ceramic capacitor 10B are electrically connected via the lands 3A2 and 3B1 and the interconnect 4C, the other of the pair of outer electrodes 14 in the first laminated ceramic capacitor 10A and the power source 5 are electrically connected via the land 3A1 and the interconnect 4A, and the other of the pair of outer electrodes 14 in the second laminated ceramic capacitor 10B and the ground terminal GND are electrically connected via the land 3B2 and the interconnect 4B.

The circuit configuration illustrated in FIG. 8B corresponds to a case where the first laminated ceramic capacitor 10A and the second laminated ceramic capacitor 10B are electrically connected in parallel. In this case, one of the pair of outer electrodes 14 in the first laminated ceramic capacitor 10A, one of the pair of outer electrodes 14 in the second laminated ceramic capacitor 10B, and the power source 5 are electrically connected via the lands 3A1 and 3B1 and the interconnect 4A, and the other of the pair of outer electrode 14 in the first laminated ceramic capacitor 10A, the other of the pair of outer electrodes 14 in the second laminated ceramic capacitor 10B, and the ground terminal GND are electrically connected via the lands 3A2 and 3B2 and the interconnect 4B. In other words, the first laminated ceramic capacitor 10A and the second laminated ceramic capacitor 10B are connected in parallel with each other to the same power source line. To rephrase, when viewed as an equivalent circuit, the first laminated ceramic capacitor 10A and the second laminated ceramic capacitor 10B are connected to the same nodes.

As shown in FIGS. 5 and 6, in the circuit board 1A according to the present first configuration example, the first laminated ceramic capacitor 10A and the second laminated ceramic capacitor 10B are disposed near or adjacent to each other, arranged along a direction parallel or substantially parallel to the main surface of the wiring board 2, in a region R of the circuit board 1A. Here, "near or adjacent to each other" refers to a range where the distance between the first laminated ceramic capacitor 10A and the second laminated ceramic capacitor 10B is no more than about 1.0 mm (the same applies hereinafter). Further preferably, the first laminated ceramic capacitor 10A and the second laminated ceramic capacitor 10B are disposed so that no other elements are present therebetween (these "other elements" include other laminated ceramic capacitors as well as other electronic components aside from laminated ceramic capacitors).

As shown in FIG. 7, the first laminated ceramic capacitor 10A and the second laminated ceramic capacitor 10B are mounted on the wiring board 2 so that the thickness directions T thereof are parallel or substantially parallel to the normal direction of the main surface of the wiring board 2 (the Z axis direction in the drawings) and so that the length directions L and width directions W thereof are parallel or substantially parallel to the main surface of the wiring board 2. Through this, one of the pair of thickness direction side surfaces 16 on each of the first laminated ceramic capacitor 10A and the second laminated ceramic capacitor 10B serves as an opposing main surface 16a that faces the main surface of the wiring board 2.

Because the first laminated ceramic capacitor 10A and the second laminated ceramic capacitor 10B each preferably have a rectangular or substantially rectangular parallelepiped shape and are mounted on the wiring board 2 so that the length directions L thereof are parallel or substantially parallel to the main surface of the wiring board 2, the respective opposing main surfaces 16a of the first laminated ceramic capacitor 10A and the second laminated ceramic capacitor 10B are rectangular or substantially rectangular, including a pair of short sides and a pair of long sides.

Here, as shown in FIGS. 5 to 7, in the circuit board 1A according to the first configuration example, the first laminated ceramic capacitor 10A and the second laminated ceramic capacitor 10B are mounted on the wiring board 2 so that a direction in which the long sides of the opposing main surface 16a of the first laminated ceramic capacitor 10A extend and a direction in which the long sides of the opposing main surface 16a of the second laminated ceramic capacitor 10B extend are perpendicular or substantially perpendicular to each other and one of the pair of length direction end surfaces 15 of the second laminated ceramic capacitor 10B opposes one of the pair of width direction side surfaces 17 of the first laminated ceramic capacitor 10A.

Preferably, the configuration is such that when viewed from the main surface of the wiring board 2, an axis parallel or substantially parallel to the width direction W passing through the center of the first laminated ceramic capacitor 10A also passes through the second laminated ceramic capacitor 10B. Further preferably, the configuration is such that when viewed from the main surface of the wiring board 2, an axis parallel or substantially parallel to the length direction L passing through the center of the second laminated ceramic capacitor 10B also passes through the first laminated ceramic capacitor 10A. Particularly positive effects can be obtained in terms of canceling out vibrations, which will be described later, by using such a configuration. Still further preferably, the configuration is such that an axis parallel or substantially parallel to the width direction W passing through the center of the first laminated ceramic capacitor 10A and an axis parallel or substantially parallel to the length direction L passing through the center of the second laminated ceramic capacitor 10B match.

As a result, when a direction parallel or substantially parallel to the main surface of the wiring board 2 and parallel or substantially parallel to the length direction L of the first laminated ceramic capacitor 10A is defined as an X axis direction and a direction parallel or substantially parallel to the main surface of the wiring board 2 and parallel or substantially parallel to the width direction W of the first laminated ceramic capacitor 10A is defined as a Y axis direction, the length direction L of the second laminated ceramic capacitor 10B is parallel or substantially parallel to the Y axis direction (that is, is parallel or substantially parallel to the width direction W of the first laminated ceramic capacitor 10A) and the width direction W of the second laminated ceramic capacitor 10B is parallel or substantially parallel to the X axis direction (that is, is parallel or substantially parallel to the length direction L of the first laminated ceramic capacitor 10A).

By using such a configuration, vibrations in the wiring board 2, resulting from distortion produced in the first laminated ceramic capacitor 10A and the second laminated ceramic capacitor 10B when a voltage is applied thereto, are partially canceled out, resulting in the occurrence of noise being significantly reduced or minimized. The following can be thought of as reasons for this effect.

Vibrations in the wiring board 2 produced by distortion in the first laminated ceramic capacitor 10A are primarily divided into a vibration mode produced by distortion along the length direction L of the first laminated ceramic capacitor 10A and a vibration mode produced by distortion along the width direction W of the first laminated ceramic capacitor 10A, and likewise, vibrations in the wiring board 2 produced by distortion in the second laminated ceramic capacitor 10B are primarily divided into a vibration mode produced by distortion along the length direction L of the second laminated ceramic capacitor 10B and a vibration mode produced by distortion along the width direction W of the second laminated ceramic capacitor 10B.

Here, in the case where the first laminated ceramic capacitor 10A and the second laminated ceramic capacitor 10B are disposed so that the length direction L of the first laminated ceramic capacitor 10A and the width direction W of the second laminated ceramic capacitor 10B are oriented in the same direction and the width direction W of the first laminated ceramic capacitor 10A and the length direction L of the second laminated ceramic capacitor 10B are oriented in the same direction as described above, a vibration mode produced by distortion along the length direction L of the first laminated ceramic capacitor 10A (see an arrow $VMA_L$ in FIG. 6) and a vibration mode produced by distortion along the width direction W of the second laminated ceramic capacitor 10B (see an arrow $VMB_W$ in FIG. 6) are in a relationship in which the vibrations cancel each other out in the X axis direction of the wiring board 2, and a vibration mode produced by distortion along the width direction W of the first laminated ceramic capacitor 10A (see an arrow $VMA_W$ in FIG. 6) and a vibration mode produced by distortion along the length direction L of the second laminated ceramic capacitor 10B (see an arrow $VMB_L$ in FIG. 6) are in a relationship in which the vibrations cancel each other out in the Y axis direction of the wiring board 2.

In other words, in the case where the wiring board 2 contracts in the X axis direction due to distortion in the first laminated ceramic capacitor 10A, the wiring board 2 expands in the X axis direction due to distortion in the second laminated ceramic capacitor 10B, whereas in the case where the wiring board 2 expands in the X axis direction due to distortion in the first laminated ceramic capacitor 10A, the wiring board 2 contracts in the X axis direction due to distortion in the second laminated ceramic capacitor 10B; as a result, vibrations produced in the wiring board 2 along the X axis direction in the region R are partially canceled out and an increase therein is significantly reduced or prevented.

Likewise, in the case where the wiring board 2 contracts in the Y axis direction due to distortion in the first laminated ceramic capacitor 10A, the wiring board 2 expands in the Y axis direction due to distortion in the second laminated ceramic capacitor 10B, and in the case where the wiring board 2 expands in the Y axis direction due to distortion in the first laminated ceramic capacitor 10A, the wiring board 2 contracts in the Y axis direction due to distortion in the second laminated ceramic capacitor 10B; as a result, vibrations produced in the wiring board 2 along the Y axis direction in the region R are partially canceled out and an increase therein is significantly reduced or prevented.

As described above, an increase in vibrations produced in the wiring board 2 is greatly suppressed or prevented, and it can thus be inferred that the overall production of noise will be significantly reduced or prevented as well. In particular, when using a configuration such as that described above, one of the width direction side surfaces 17 of the first laminated ceramic capacitor 10A opposes one of the length direction end surfaces 15 of the second laminated ceramic capacitor 10B, and thus the first laminated ceramic capacitor 10A and the second laminated ceramic capacitor 10B are disposed so as to overlap in the Y axis direction; as a result, the vibration modes produced in the wiring board 2 along the Y axis direction transmit vibrations toward each other, and a more efficient vibration cancellation effect is thus obtained.

Note that a distance between the width direction side surface 17 of the first laminated ceramic capacitor 10A that opposes the second laminated ceramic capacitor 10B and the length direction end surface 15 of the second laminated ceramic capacitor 10B that opposes the first laminated ceramic capacitor 10A is preferably set to no more than about 1.0 mm, and further preferably set to no more than about 0.5 mm, for example, so that the vibration waves produced in the wiring board 2 are in a mutually-cancelling phase relationship.

In the circuit board 1A according to the present first configuration example, the first laminated ceramic capacitor 10A and the second laminated ceramic capacitor 10B are not respectively mounted on the front and rear surfaces of the wiring board 2, and it is not necessary to use a configuration in which ripple voltages are applied respectively to the first laminated ceramic capacitor 10A and the second laminated ceramic capacitor 10B in order to realize an amplitude relationship in which the vibrations in vibration waves transmitted to the wiring board 2 have approximately opposite phases; therefore a generally small-sized configuration can be realized.

Accordingly, by using the configuration according to the present first configuration example as described above, the circuit board 1A capable of reducing noise while preventing an increase in the size of the electronic device is realized.

Furthermore, in the circuit board 1A according to the present first configuration example, the first laminated ceramic capacitor 10A and the second laminated ceramic capacitor 10B are not respectively mounted on the front and rear surfaces of the wiring board 2, and it is not necessary to use a configuration in which ripple voltages are applied respectively to the first laminated ceramic capacitor 10A and the second laminated ceramic capacitor 10B in order to achieve an amplitude relationship in which the vibrations in vibration waves transmitted to the wiring board 2 have approximately opposite phases. Thus, the configuration can be applied in cases such as where electronic components can only be mounted on one surface of the wiring board 2, and because the configuration does not require extra space on the circuit board 1A, a reduction in noise is achieved while ensuring a high level of design freedom and avoiding large limitations on the mounting layout of the electronic components, the circuit configuration, and so on.

Note that in cases such as that shown in FIG. 8A, where the first laminated ceramic capacitor 10A and the second laminated ceramic capacitor 10B are electrically connected in series, it is preferable for the conductive pattern to be configured so that one of the pair of lands 3A1 and 3A2 provided corresponding to the first laminated ceramic capacitor 10A and the land 3B1 that, of the pair of lands 3B1 and 3B2 provided corresponding to the second laminated ceramic capacitor 10B, is closest to the pair of lands 3A1 and 3A2 are connected by the interconnect 4C (see FIG. 8A) provided on the wiring board 2 without taking a roundabout route as much as possible. Using such a configuration not only makes it possible to prevent an increase in the size of the circuit board 1A, but also makes it possible to reduce loop inductance in the circuitry provided on the wiring board 2.

Figure 9:
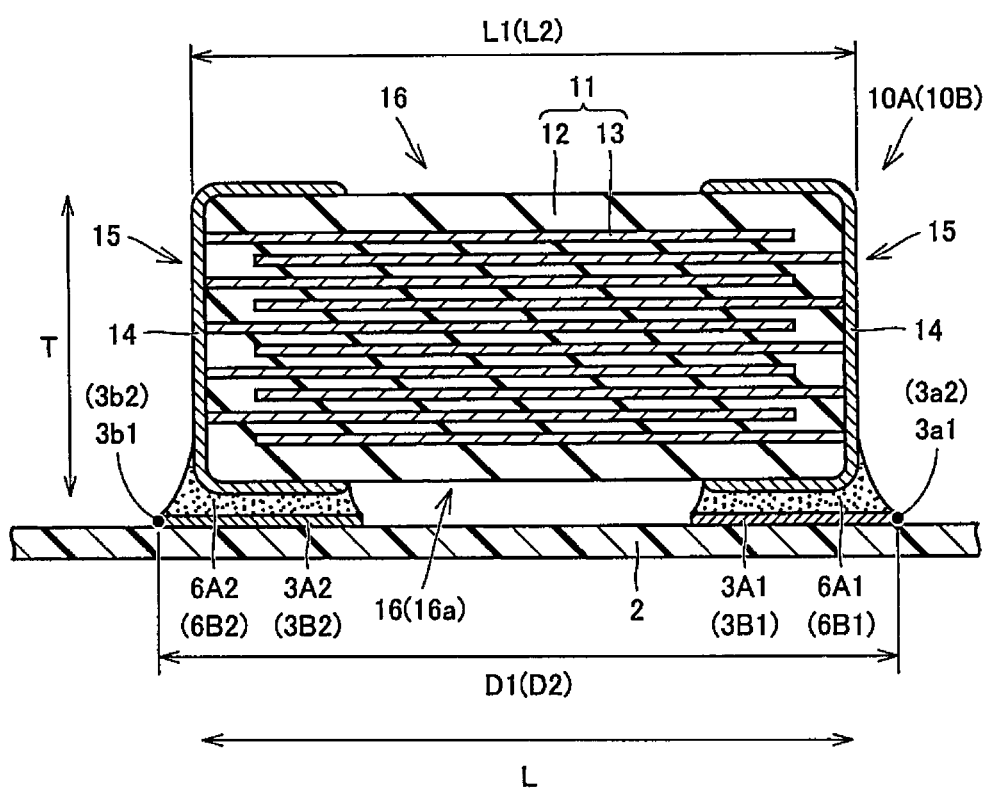
FIG. 9 is a cross-sectional view illustrating a preferred structure for mounting the laminated ceramic capacitors shown in FIGS. 5 and 6 onto a wiring board.

FIG. 9 is a cross-sectional view illustrating a preferred structure configured to mount the laminated ceramic capacitors shown in FIGS. 5 and 6 onto the wiring board. A more preferable structure to mount the laminated ceramic capacitors onto the wiring board when the aforementioned first configuration example is used will be described hereinafter with reference to FIG. 9.

Although FIG. 9 illustrates a case where the preferred mounting structure is applied to the aforementioned first laminated ceramic capacitor 10A as an example, it is preferable for the same mounting structure to be applied to the second laminated ceramic capacitor 10B as well. Accordingly, reference numerals corresponding to the second laminated ceramic capacitor 10B have been added in parentheses in FIG. 9 so that the application of the mounting structure in the second laminated ceramic capacitor 10B can also be understood from FIG. 9.

In the mounting structure for the first laminated ceramic capacitor 10A shown in FIG. 9, the pair of lands 3A1 and 3A2 electrically connected to the pair of outer electrodes 14 of the first laminated ceramic capacitor 10A via the joining members 6A1 and 6A2 each extend to outer side portions of the corresponding end portions of the first laminated ceramic capacitor 10A (that is, the outer side portions of the corresponding length direction end surfaces 15 of the first laminated ceramic capacitor 10A) in the direction in which the long sides of the opposing main surface 16a of the first laminated ceramic capacitor 10A extends (that is, in the length direction L of the first laminated ceramic capacitor 10A).

Likewise, in the mounting structure for the second laminated ceramic capacitor 10B indicated in the parentheses in FIG. 9, the pair of lands 3B1 and 3B2 electrically connected to the pair of outer electrodes 14 of the second laminated ceramic capacitor 10B via the joining members 6B1 and 6B2 each extend to outer side portions of the corresponding end portions of the second laminated ceramic capacitor 10B (that is, the outer side portions of the corresponding length direction end surfaces 15 of the second laminated ceramic capacitor 10B) in the direction in which the long sides of the opposing main surface 16a of the second laminated ceramic capacitor 10B extends (that is, in the length direction L of the second laminated ceramic capacitor 10B), in the same manner as in the aforementioned mounting structure for the first laminated ceramic capacitor 10A.

By using such a configuration, fillets are provided on the joining members 6A1, 6A2, 6B1, and 6B2 at appropriate sizes, resulting in an appropriate increase in the size of the surface area of the joints between the first laminated ceramic capacitor 10A and second laminated ceramic capacitor 10B and the wiring board 2; this in turn makes it possible to ensure that the first laminated ceramic capacitor 10A and the second laminated ceramic capacitor 10B are mounted in a stable manner.

In the mounting structure for the first laminated ceramic capacitor 10A illustrated in FIG. 9, when the length of the first laminated ceramic capacitor 10A along the length direction L is represented by L1, an end portion of the land 3A1, serving as a first land, that is on the side opposite from the other land 3A2, serving as a second land, is represented by 3a1, an end portion of the land 3A2, serving as the second land, that is on the side opposite from the land 3A1, serving as the first land, is represented by 3b1, and a distance between the end portion 3a1 and the end portion 3b1 in the length direction L is represented by D1, it is particularly preferable for the distance D1 to be set to no less than about 1.1 times the length L1 and no greater than about 1.3 times the length L1, for example.

Likewise, in the mounting structure for the second laminated ceramic capacitor 10B indicated in the parentheses in FIG. 9, when the length of the second laminated ceramic capacitor 10B along the length direction L is represented by L2, an end portion of the land 3B1, serving as a third land, that is on the side opposite from the other land 3B2, serving as a fourth land, is represented by 3a2, an end portion of the land 3B2, serving as the fourth land, that is on the side opposite from the land 3B1, serving as the third land, is represented by 3b2, and a distance between the end portion 3a2 and the end portion 3b2 in the length direction L is represented by D2, it is particularly preferable for the distance D2 to be set to no less than about 1.1 times the length L2 and no greater than about 1.3 times the length L2, for example, in the same manner as in the aforementioned mounting structure for the first laminated ceramic capacitor 10A.

This is because setting the distances D1 and D2 to be no less than about 1.1 times the lengths L1 and L2, respectively, increases the mounting stability of the first laminated ceramic capacitor 10A and the second laminated ceramic capacitor 10B, and because setting the distances D1 and D2 to be no more than about 1.3 times the lengths L1 and L2, respectively, for example, makes it possible to determine that a noise reduction effect is effectively obtained based on a result of a second verification test, which will be mentioned later (see "second verification test" below for details).

On the other hand, referring to FIGS. 5 to 7, it is preferable for the length of the lands 3A1 and 3A2 along the width direction W of the first laminated ceramic capacitor 10A to be about 0.8 times to about 1.0 times the outer dimension of the first laminated ceramic capacitor 10A in the width direction W thereof, for example. In this case, vibrations produced in the wiring board 2 along the Y axis direction are more efficiently cancelled out. Furthermore, in this case, it is difficult for positional skew to arise when mounting the first laminated ceramic capacitor 10A, which increases the mounting stability and furthermore makes it possible to prevent a drop in the effect that cancels out the vibrations resulting from the orientation of the first laminated ceramic capacitor 10A being shifted relative to the wiring board 2.

Likewise, referring to FIGS. 5 and 6, it is preferable for the length of the lands 3B1 and 3B2 along the width direction W of the second laminated ceramic capacitor 10B to be about 0.8 times to about 1.0 times the outer dimension of the second laminated ceramic capacitor 10B in the width direction W thereof, for example. In this case, vibrations produced in the wiring board 2 along the X axis direction are more efficiently cancelled out. Furthermore, in this case, it is difficult for positional skew to arise when mounting the second laminated ceramic capacitor 10B, which increases the mounting stability and furthermore makes it possible to prevent a drop in the effect that cancels out the vibrations resulting from the orientation of the second laminated ceramic capacitor 10B being shifted relative to the wiring board 2.

Although FIG. 6 depicts the outer dimensions of the lands 3A1 and 3A2 along the width direction W of the first laminated ceramic capacitor 10A as being greater than the outer dimension of the first laminated ceramic capacitor 10A in the width direction W thereof and depicts the outer dimensions of the lands 3B1 and 3B2 along the width direction W of the second laminated ceramic capacitor 10B as being greater than the outer dimension of the second laminated ceramic capacitor 10B in the width direction W thereof for easier visual understanding, these dimensions are actually the same in the present first configuration example.

Second Configuration Example

Figure 10:
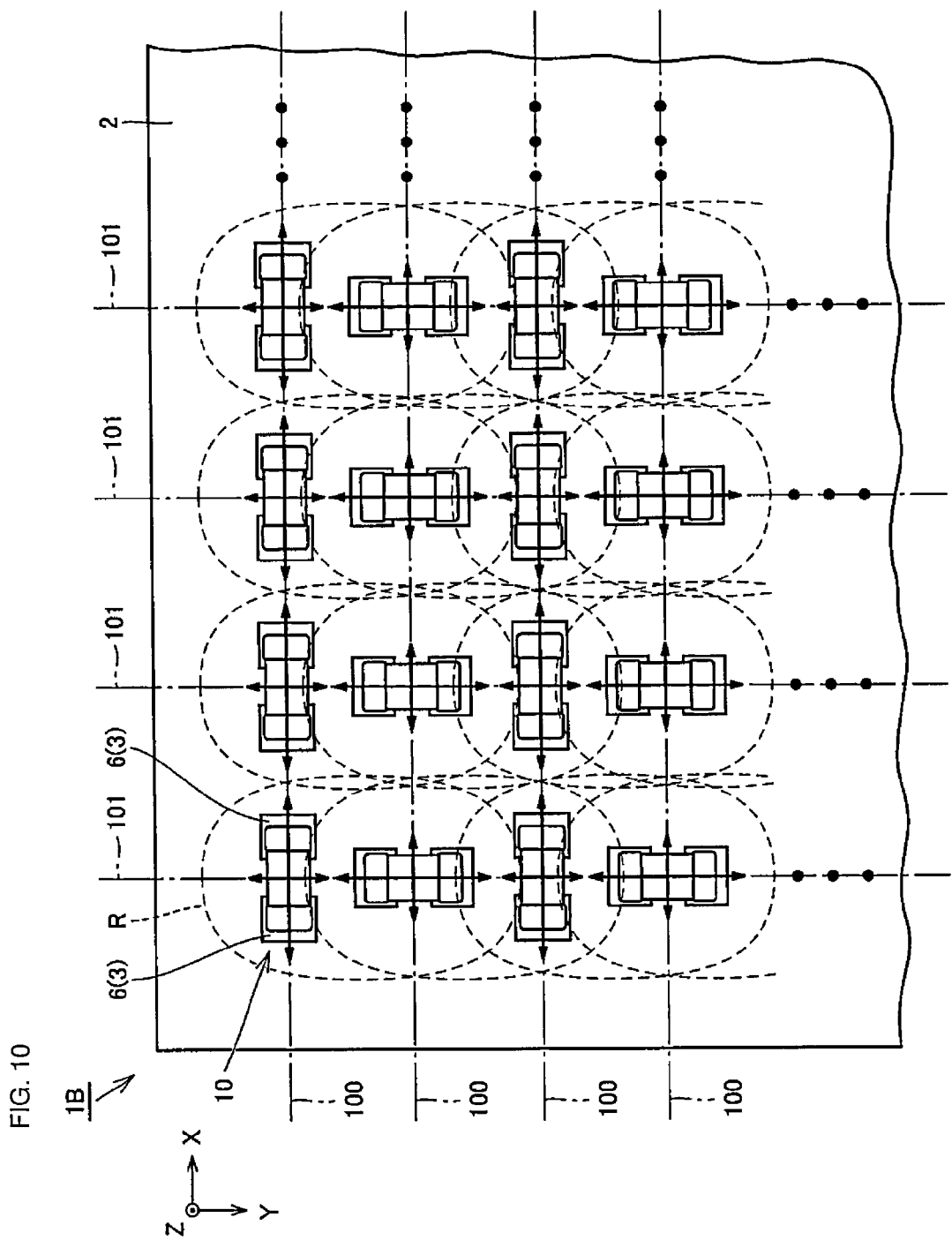
FIG. 10 is a schematic plan view illustrating a layout of laminated ceramic capacitors provided on a circuit board according to a second configuration example.

FIG. 10 is a schematic plan view illustrating a layout of laminated ceramic capacitors provided on a circuit board according to a second configuration example.

Like the first configuration example, the present second configuration example focuses on a pair of laminated ceramic capacitors that have the same design specifications (the same capacities and the same sizes) and are electrically connected in series or in parallel via a conductive pattern provided on a wiring board, as the plurality of laminated ceramic capacitors included in the aforementioned laminated ceramic capacitor group, but furthermore provides a plurality of laminated ceramic capacitor groups.

As shown in FIG. 10, a circuit board 1B according to the present second configuration example takes the layout of the first laminated ceramic capacitor 10A and the second laminated ceramic capacitor 10B described in the aforementioned first configuration example as a unit layout pattern, and disposes the unit layout pattern in multiple along the X axis direction and the Y axis direction.

To be more specific, in the circuit board 1B according to the present second configuration example, the individual laminated ceramic capacitors 10 are disposed in a matrix (in rows and columns) upon the wiring board 2, with the laminated ceramic capacitors 10 in each row following straight lines 100 extending in the X axis direction being disposed in straight lines and the laminated ceramic capacitors 10 in each column following straight lines 101 extending in the Y axis direction being disposed in straight lines.

Furthermore, with the circuit board 1B according to the present second configuration example, the arrangements of the plurality of laminated ceramic capacitors 10 in specific rows are adjusted so that one of the length direction L and the width direction W of those laminated ceramic capacitors 10 follows the X axis direction and the laminated ceramic capacitors 10 in the specific row are all oriented in the same direction, and furthermore, the arrangements of each row are adjusted so that the laminated ceramic capacitors 10 in adjacent rows are oriented in different directions between the adjacent rows.

When such a configuration is used, the laminated ceramic capacitors 10 adjacent in the Y axis direction have the same relationship as the first laminated ceramic capacitor 10A and the second laminated ceramic capacitor 10B in the aforementioned first configuration example (a detailed description thereof will be omitted here to avoid repetition).

Accordingly, using the circuit board 1B according to the present second configuration example significantly reduces or prevents an increase in vibrations in an area of the overall wiring board 2 where the laminated ceramic capacitors 10 are disposed in a matrix, and noise is significantly reduced or prevented, while preventing an increase in the size of the circuit board 1B as a result.

Although FIG. 10 depicts the outer dimensions of the lands 3 along the width direction W of the laminated ceramic capacitors 10 as being greater than the outer dimension of the laminated ceramic capacitors 10 in the width direction W thereof for easier visual understanding, these dimensions are actually preferably the same in the present second configuration example.

Third Configuration Example

Figure 11:
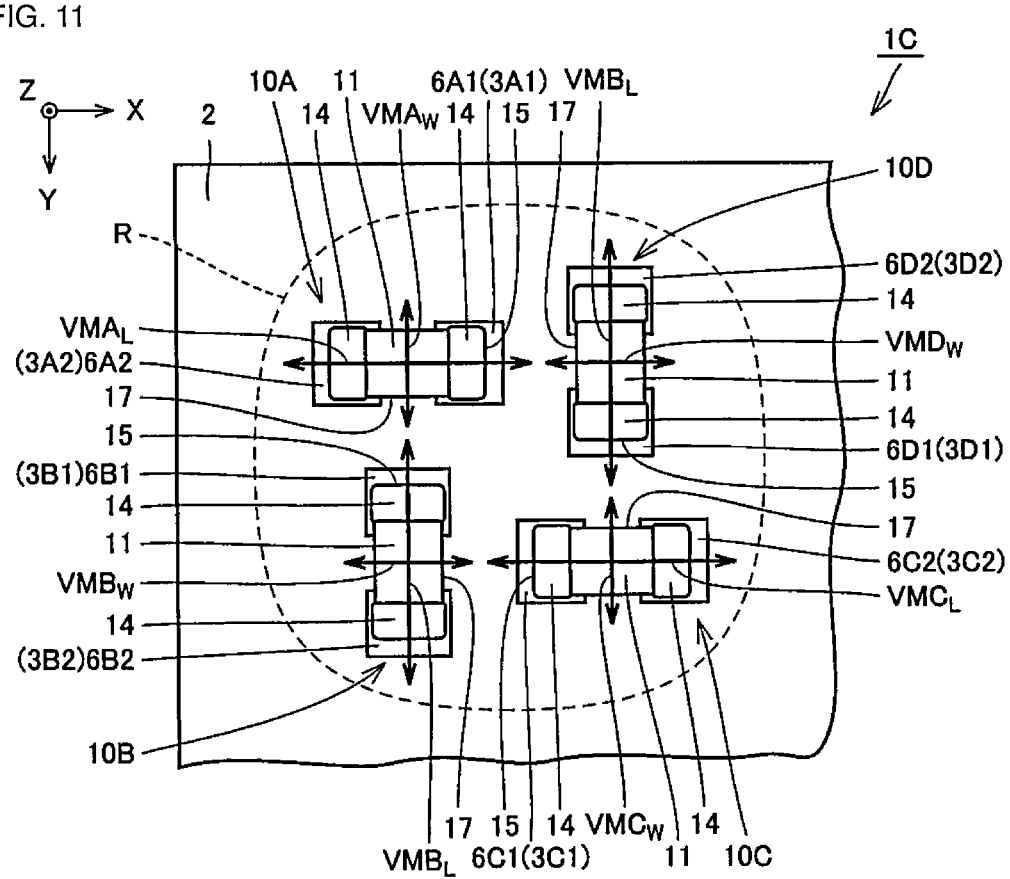
FIG. 11 is a schematic plan view illustrating a layout of laminated ceramic capacitors provided on a circuit board according to a third configuration example.

FIG. 11 is a schematic plan view illustrating a layout of laminated ceramic capacitors provided on a circuit board according to a third configuration example.

The present third configuration example focuses on four laminated ceramic capacitors that have the same design specifications (the same capacities and the same sizes) and are electrically connected in series or in parallel via a conductive pattern provided on a wiring board, as the plurality of laminated ceramic capacitors included in the aforementioned laminated ceramic capacitor group.

As shown in FIG. 11, in a circuit board 1C according to the present third configuration example, the first laminated ceramic capacitor 10A, the second laminated ceramic capacitor 10B, a third laminated ceramic capacitor 10C, and a fourth laminated ceramic capacitor 10D are disposed near or adjacent to each other, arranged along a direction parallel or substantially parallel to the main surface of the wiring board 2, in a region R of the circuit board 1C.

Here, as in the first configuration example, the first laminated ceramic capacitor 10A, the second laminated ceramic capacitor 10B, the third laminated ceramic capacitor 10C, and the fourth laminated ceramic capacitor 10D are mounted on the wiring board 2 so that the thickness directions T thereof are parallel or substantially parallel to the normal direction (the Z axis direction in FIG. 11) of the main surface of the wiring board 2 and so that the length directions L and width directions W thereof are parallel or substantially parallel to the main surface of the wiring board 2. Through this, one of the pair of thickness direction side surfaces 16 on each of the first laminated ceramic capacitor 10A, the second laminated ceramic capacitor 10B, the third laminated ceramic capacitor 10C, and the fourth laminated ceramic capacitor 10D serves as the opposing main surface 16a (see FIG. 7) that faces the main surface of the wiring board 2, as in the first configuration example.

Because the first laminated ceramic capacitor 10A, the second laminated ceramic capacitor 10B, the third laminated ceramic capacitor 10C, and the fourth laminated ceramic capacitor 10D each preferably have a rectangular or substantially rectangular parallelepiped shape and are furthermore mounted on the wiring board 2 so that the length directions L thereof are parallel or substantially parallel to the main surface of the wiring board 2, the respective opposing main surfaces 16a of the first laminated ceramic capacitor 10A, the second laminated ceramic capacitor 10B, the third laminated ceramic capacitor 10C, and the fourth laminated ceramic capacitor 10D are rectangular or substantially rectangular, having a pair of short sides and a pair of long sides.

With the circuit board 1C according to the third configuration example, the first laminated ceramic capacitor 10A, the second laminated ceramic capacitor 10B, the third laminated ceramic capacitor 10C, and the fourth laminated ceramic capacitor 10D are mounted on the wiring board 2 so that a direction in which the long sides of the opposing main surface 16a of the first laminated ceramic capacitor 10A extend and a direction in which the long sides of the opposing main surface 16a of the second laminated ceramic capacitor 10B extend are perpendicular or substantially perpendicular to each other, a direction in which the long sides of the opposing main surface 16a of the second laminated ceramic capacitor 10B extend and a direction in which the long sides of the opposing main surface 16a of the third laminated ceramic capacitor 10C extend are perpendicular or substantially perpendicular to each other, a direction in which the long sides of the opposing main surface 16a of the third laminated ceramic capacitor 10C extend and a direction in which the long sides of the opposing main surface 16a of the fourth laminated ceramic capacitor 10D extend are perpendicular or substantially perpendicular to each other, and a direction in which the long sides of the opposing main surface 16a of the fourth laminated ceramic capacitor 10D extend and a direction in which the long sides of the opposing main surface 16a of the first laminated ceramic capacitor 10A extend are perpendicular or substantially perpendicular to each other, and so that one of the pair of width direction side surfaces 17 of the first laminated ceramic capacitor 10A opposes one of the pair of length direction end surfaces 15 of the second laminated ceramic capacitor 10B, one of the pair of width direction side surfaces 17 of the second laminated ceramic capacitor 10B opposes one of the pair of length direction end surfaces 15 of the third laminated ceramic capacitor 10C, one of the pair of width direction side surfaces 17 of the third laminated ceramic capacitor 10C opposes one of the pair of length direction end surfaces 15 of the fourth laminated ceramic capacitor 10D, and one of the pair of width direction side surfaces 17 of the fourth laminated ceramic capacitor 10D opposes one of the pair of length direction end surfaces 15 of the first laminated ceramic capacitor 10A.

When such a configuration is used, of the first laminated ceramic capacitor 10A, the second laminated ceramic capacitor 10B, the third laminated ceramic capacitor 10C, and the fourth laminated ceramic capacitor 10D, laminated ceramic capacitors that are near or adjacent to each other have the same relationship as the first laminated ceramic capacitor 10A and the second laminated ceramic capacitor 10B in the aforementioned first configuration example (a detailed description thereof will be omitted here to avoid repetition).

Accordingly, even in the case where four laminated ceramic capacitors are provided, by using the circuit board 1C according to the present third configuration example, vibrations in the wiring board 2, resulting from distortion produced in the four laminated ceramic capacitors when a voltage is applied thereto, are partially canceled out, resulting in the occurrence of noise being significantly reduced or prevented, which in turn makes it possible to reduce noise while preventing an increase in the size of the circuit board 1C.

In particular, when using a configuration such as that described above, one of the width direction side surfaces 17 of the first laminated ceramic capacitor 10A opposes one of the length direction end surfaces 15 of the second laminated ceramic capacitor 10B, and thus the first laminated ceramic capacitor 10A and the second laminated ceramic capacitor 10B are disposed so as to overlap in the Y axis direction, one of the width direction side surfaces 17 of the second laminated ceramic capacitor 10B opposes one of the length direction end surfaces 15 of the third laminated ceramic capacitor 10C, and thus the second laminated ceramic capacitor 10B and the third laminated ceramic capacitor 10C are disposed so as to overlap in the X axis direction, one of the width direction side surfaces 17 of the third laminated ceramic capacitor 10C opposes one of the length direction end surfaces 15 of the fourth laminated ceramic capacitor 10D, and thus the third laminated ceramic capacitor 10C and the fourth laminated ceramic capacitor 10D are disposed so as to overlap in the Y axis direction, and one of the width direction side surfaces 17 of the fourth laminated ceramic capacitor 10D opposes one of the length direction end surfaces 15 of the first laminated ceramic capacitor 10A, and thus the fourth laminated ceramic capacitor 10D and the first laminated ceramic capacitor 10A are disposed so as to overlap in the X axis direction. As a result, the vibration modes produced in the wiring board 2 along the X axis direction and the Y axis direction transmit vibrations toward each other, and a more efficient vibration cancellation effect is obtained. Furthermore, the four laminated ceramic capacitors are capable of being provided in a smaller mounting area, and thus an increase in the size of the circuit board 1C is prevented with further certainty.

Although FIG. 11 depicts the outer dimensions of the lands 3A1 and 3A2 along the width direction W of the first laminated ceramic capacitor 10A as being greater than the outer dimension of the first laminated ceramic capacitor 10A in the width direction W thereof, depicts the outer dimensions of the lands 3B1 and 3B2 along the width direction W of the second laminated ceramic capacitor 10B as being greater than the outer dimension of the second laminated ceramic capacitor 10B in the width direction W thereof, depicts the outer dimensions of lands 3C1 and 3C2 along the width direction W of the third laminated ceramic capacitor 10C as being greater than the outer dimension of the third laminated ceramic capacitor 10C in the width direction W thereof, and depicts the outer dimensions of lands 3D1 and 3D2 along the width direction W of the fourth laminated ceramic capacitor 10D as being greater than the outer dimension of the fourth laminated ceramic capacitor 10D in the width direction W thereof for easier visual understanding, these dimensions are actually the same in the present third configuration example.

Meanwhile, in FIG. 11, the vibration modes caused by distortion along the length directions L of the first laminated ceramic capacitor 10A, the second laminated ceramic capacitor 10B, the third laminated ceramic capacitor 10C, and the fourth laminated ceramic capacitor 10D are schematically indicated by arrows $VMA_L$, $VMB_L$, $VMC_L$, and $VMD_L$, whereas the vibration modes caused by distortion along the width directions W of the first laminated ceramic capacitor 10A, the second laminated ceramic capacitor 10B, the third laminated ceramic capacitor 10C, and the fourth laminated ceramic capacitor 10D are schematically indicated by arrows $VMA_W$, $VMB_W$, $VMC_W$, and $VMD_W$.

Fourth Configuration Example

Figure 12:
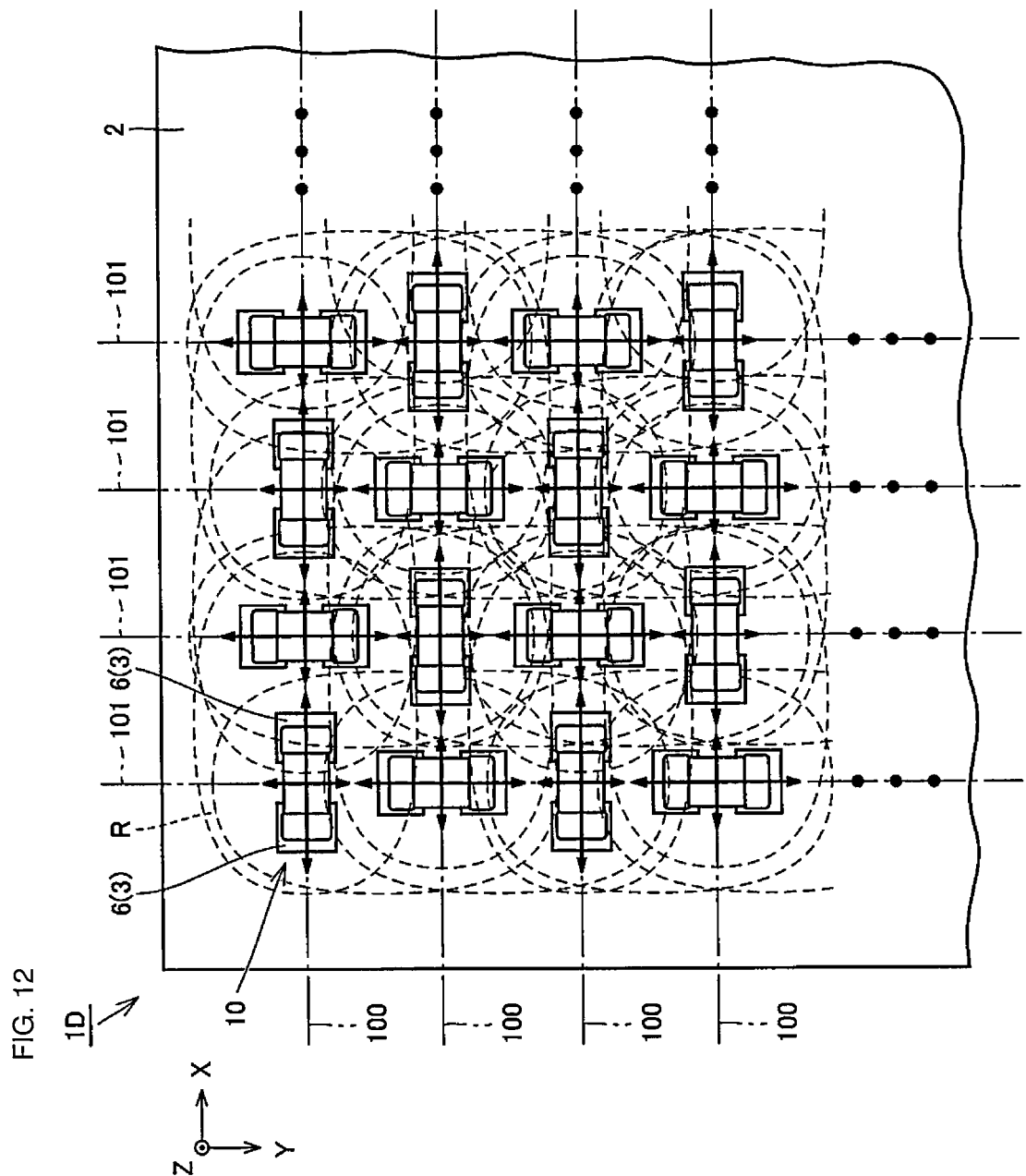
FIG. 12 is a schematic plan view illustrating a layout of laminated ceramic capacitors provided on a circuit board according to a fourth configuration example.

FIG. 12 is a schematic plan view illustrating a layout of laminated ceramic capacitors provided on a circuit board according to a fourth configuration example.

Like the third configuration example, the present fourth configuration example focuses on four laminated ceramic capacitors that have the same design specifications (the same capacities and the same sizes) and are electrically connected in series or in parallel via a conductive pattern provided on a wiring board, as the plurality of laminated ceramic capacitors included in the aforementioned laminated ceramic capacitor group, but further provides a plurality of laminated ceramic capacitor groups.

As shown in FIG. 12, a circuit board 1D according to the present fourth configuration example preferably adopts the layout of the first laminated ceramic capacitor 10A, the second laminated ceramic capacitor 10B, the third laminated ceramic capacitor 10C, and the fourth laminated ceramic capacitor 10D described in the aforementioned third configuration example as a unit layout pattern, and disposes the unit layout pattern in multiple along the X axis direction and the Y axis direction.

To be more specific, in the circuit board 1D according to the present fourth configuration example, the individual laminated ceramic capacitors 10 are disposed in a matrix (in rows and columns) upon the wiring board 2, with the laminated ceramic capacitors 10 in each row following straight lines 100 extending in the X axis direction being disposed in straight lines and the laminated ceramic capacitors 10 in each column following straight lines 101 extending in the Y axis direction being disposed in straight lines.

Furthermore, with the circuit board 1D according to the present fourth configuration example, the arrangements of the laminated ceramic capacitors 10 in specific rows are adjusted so that the plurality of laminated ceramic capacitors 10 in each row are oriented with adjacent laminated ceramic capacitors 10 facing different directions and so that the length directions L and the width directions W of those laminated ceramic capacitors 10 follow the X axis direction in an alternating manner, and the arrangements of the laminated ceramic capacitors 10 in specific columns are adjusted so that the plurality of laminated ceramic capacitors 10 in each column are oriented with adjacent laminated ceramic capacitors 10 facing different directions and so that the length directions L and the width directions W of those laminated ceramic capacitors 10 follow the Y axis direction in an alternating manner.

When such a configuration is used, the laminated ceramic capacitors 10 adjacent in the X axis direction and the Y axis direction have the same relationship as the first laminated ceramic capacitor 10A and the second laminated ceramic capacitor 10B in the aforementioned first configuration example (a detailed description thereof will be omitted here to avoid repetition).

Accordingly, using the circuit board 1D according to the present fourth configuration example significantly reduces or prevents an increase in vibrations in an area of the overall wiring board 2 where the laminated ceramic capacitors 10 are disposed in a matrix, and noise is significantly reduced or prevented, while preventing an increase in the size of the circuit board 1D as a result.

Although FIG. 12 depicts the outer dimensions of lands 3 along the width direction W of the laminated ceramic capacitors 10 as being greater than the outer dimension of the laminated ceramic capacitors 10 in the width direction W thereof for easier visual understanding, these dimensions are actually the same in the present fourth configuration example.

Fifth Configuration Example

Figure 13:
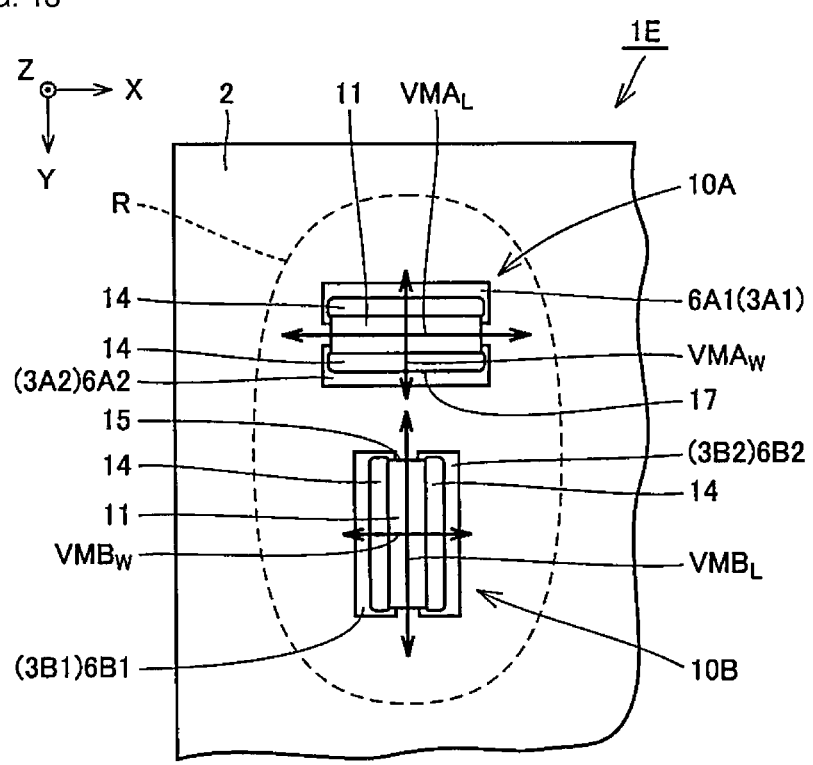
FIG. 13 is a schematic plan view illustrating a layout of laminated ceramic capacitors provided on a circuit board according to a fifth configuration example.

FIG. 13 is a schematic plan view illustrating a layout of laminated ceramic capacitors provided on a circuit board according to a fifth configuration example.

As in the aforementioned first configuration example, the present fifth configuration example focuses on a pair of laminated ceramic capacitors that have the same design specifications (the same capacities and the same sizes) and are electrically connected in series or in parallel via a conductive pattern provided on a wiring board, as the plurality of laminated ceramic capacitors included in the aforementioned laminated ceramic capacitor group.

As shown in FIG. 13, a circuit board 1E according to the fifth configuration example differs from the circuit board 1A according to the first configuration example in terms of the positions of the pair of outer electrodes 14 provided on the outer surfaces of the multilayer bodies 11 in the first laminated ceramic capacitor 10A and the second laminated ceramic capacitor 10B mounted on the wiring board 2.

Specifically, although the aforementioned first configuration example illustrates an example where capacitors in which the pair of outer electrodes 14 are configured so as to cover the outer surface of both end portions of the multilayer body 11 in the length direction L are mounted on the wiring board 2 as the first laminated ceramic capacitor 10A and the second laminated ceramic capacitor 10B, the present fifth configuration example illustrates an example where capacitors in which the pair of outer electrodes 14 are configured so as to cover the outer surface of both end portions of the multilayer body 11 in the width direction W are mounted on the wiring board 2 as the first laminated ceramic capacitor 10A and the second laminated ceramic capacitor 10B.

In this case as well, the lands 3A1, 3A2, 3B1, and 3B2 are provided in positions on the main surface of the wiring board 2 that correspond to the respective pairs of outer electrodes 14 of the first laminated ceramic capacitor 10A and the second laminated ceramic capacitor 10B, and the outer electrodes 14 are joined to the corresponding lands 3A1, 3A2, 3B1, and 3B2 by the joining members 6A1, 6A2, 6B1, and 6B2.

Even when such a configuration is used, the first laminated ceramic capacitor 10A and the second laminated ceramic capacitor 10B are in the same relationship as the relationship described in the aforementioned first configuration example, and thus vibrations in the wiring board 2, resulting from distortion produced in the first laminated ceramic capacitor 10A and the second laminated ceramic capacitor 10B when a voltage is applied thereto, are partially canceled out, resulting in the occurrence of noise being significantly reduced or prevented, which in turn makes it possible to significantly reduce or prevent noise while preventing an increase in the size of the circuit board 1E (a detailed description thereof will be omitted here to avoid repetition).

Although FIG. 13 depicts the outer dimensions of the lands 3A1 and 3A2 along the length direction L of the first laminated ceramic capacitor 10A as being greater than the outer dimension of the first laminated ceramic capacitor 10A in the length direction L thereof and depicts the outer dimensions of the lands 3B1 and 3B2 along the length direction L of the second laminated ceramic capacitor 10B as being greater than the outer dimension of the second laminated ceramic capacitor 10B in the length direction L thereof for easier visual understanding, these dimensions are actually the same in the present fifth configuration example.

Sixth Configuration Example

Figure 14:
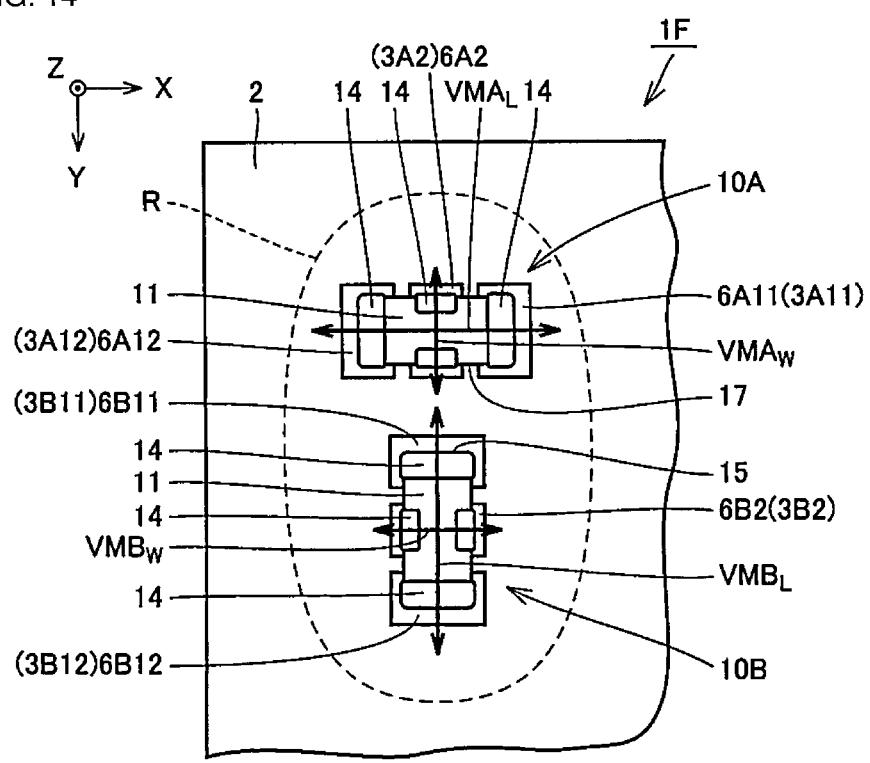
FIG. 14 is a schematic plan view illustrating a layout of laminated ceramic capacitors provided on a circuit board according to a sixth configuration example.

FIG. 14 is a schematic plan view illustrating a layout of laminated ceramic capacitors provided on a circuit board according to a sixth configuration example.

As in the aforementioned first configuration example, the present sixth configuration example focuses on a pair of laminated ceramic capacitors that have the same design specifications (the same capacities and the same sizes) and are electrically connected in series or in parallel via a conductive pattern provided on a wiring board, as the plurality of laminated ceramic capacitors included in the aforementioned laminated ceramic capacitor group.

As shown in FIG. 14, a circuit board 1F according to the sixth configuration example differs from the circuit board 1A according to the first configuration example in terms of the configurations and positions of the outer electrodes 14 provided on the outer surfaces of the multilayer bodies 11 in the first laminated ceramic capacitor 10A and the second laminated ceramic capacitor 10B mounted on the wiring board 2.

Specifically, although the aforementioned first configuration example illustrates an example where capacitors in which the pair of outer electrodes 14 are configured so as to cover the outer surface of both end portions of the multilayer body 11 in the length direction L are mounted on the wiring board 2 as the first laminated ceramic capacitor 10A and the second laminated ceramic capacitor 10B, the present sixth configuration example illustrates an example where capacitors, in which two electrically equivalent outer electrodes 14 are provided in an isolated manner so as to cover the outer surface of both end portions of the multilayer body 11 in the length direction L and a single outer electrode 14 is provided so as to partially cover the outer surface of both end portions of the multilayer body 11 in the width direction W, are mounted on the wiring board 2 as the first laminated ceramic capacitor 10A and the second laminated ceramic capacitor 10B.

In this case as well, lands 3A11 and 3A12, the land 3A2, lands 3B11 and 3B12, and the land 3B2 are provided in positions on the main surface of the wiring board 2 that correspond to the respective three outer electrodes 14 of the first laminated ceramic capacitor 10A and the second laminated ceramic capacitor 10B, and the outer electrodes 14 are joined to the corresponding lands 3A11, 3A12, 3A2, 3B11, 3B12, and 3B2 by joining members 6A11 and 6A12, the joining member 6A2, joining members 6B11 and 6B12, and the joining member 6B2.

Even when such a configuration is used, the first laminated ceramic capacitor 10A and the second laminated ceramic capacitor 10B are in the same relationship as the relationship described in the aforementioned first configuration example, and thus vibrations in the wiring board 2, resulting from distortion produced in the first laminated ceramic capacitor 10A and the second laminated ceramic capacitor 10B when a voltage is applied thereto, are partially canceled out, resulting in the occurrence of noise being significantly reduced or prevented, which in turn makes it possible to reduce noise while preventing an increase in the size of the circuit board 1F (a detailed description thereof will be omitted here to avoid repetition).

Seventh Configuration Example

Figure 15:
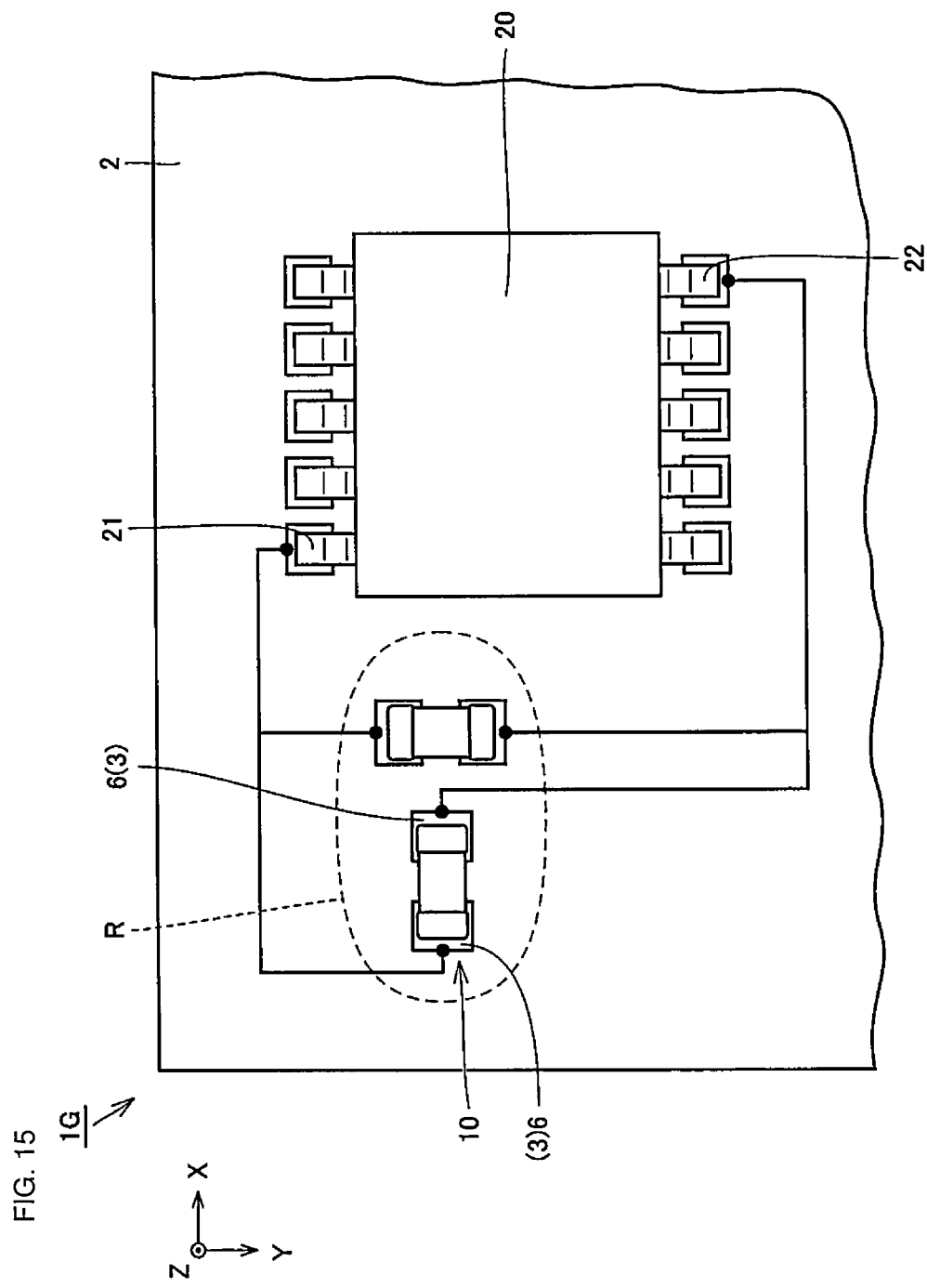
FIG. 15 is a schematic plan view illustrating a layout of laminated ceramic capacitors and an IC provided on a circuit board according to a seventh configuration example.

FIG. 15 is a schematic plan view illustrating a layout of laminated ceramic capacitors and an IC provided on a circuit board according to a seventh configuration example.

As shown in FIG. 15, a circuit board 1G according to the present seventh configuration example includes the wiring board 2, an IC (integrated circuit) 20 serving as an integrated circuit element mounted on the wiring board 2, and a capacitor element group including two decoupling laminated ceramic capacitors 10 that are connected to the IC by being mounted on the wiring board 2; the layout of the first laminated ceramic capacitor 10A and the second laminated ceramic capacitor 10B on the circuit board 1A according to the aforementioned first configuration example is applied to the layout of the two decoupling laminated ceramic capacitors 10. Here, the two decoupling laminated ceramic capacitors 10 have different capacities.

More specifically, the IC 20 includes a plurality of terminals for input/output from/to external circuits, and a power source terminal 21 and a ground terminal 22 are included in that plurality of terminals. The aforementioned two decoupling laminated ceramic capacitors 10 are disposed on the main surface of the wiring board 2 on which the IC 20 is mounted, near the IC 20, and arranged along a direction parallel or substantially parallel to the main surface. Here, more preferably, the capacitor element group including the two decoupling laminated ceramic capacitors 10 and the IC 20 are disposed so that no other elements (electronic components or the like) are positioned therebetween, as illustrated in FIG. 15.

The lands 3 respectively connected via joining members 6 to outer electrodes provided in each of the two decoupling laminated ceramic capacitors 10 are connected to the power source terminal 21 and the ground terminal 22 of the IC 20 via interconnects. Through this, the two decoupling laminated ceramic capacitors 10 are electrically connected in parallel between the power source terminal 21 and the ground terminal 22.

Here, the decoupling laminated ceramic capacitors are connected between the power source line and the ground in order to significantly reduce or prevent fluctuations in the power source voltage, inter-circuit interference, and so on. It is typical for a decoupling circuit including such decoupling laminated ceramic capacitors to be configured by electrically connecting a plurality of laminated ceramic capacitors having different capacities in parallel between the power source line and the ground in order to achieve high noise absorbing effects across a wide frequency range. Note that a variety of devices can be considered as the IC provided with the decoupling circuit, such as a CPU (central processing unit), a GPU (graphics processing unit), an APU (accelerated processing unit), or the like.

As described above, with the circuit board 1G according to the seventh configuration example, the layout of the first laminated ceramic capacitor 10A and the second laminated ceramic capacitor 10B on the circuit board 1A described in the aforementioned first configuration example is applied to the layout of the two decoupling laminated ceramic capacitors 10. By using such a configuration, vibrations produced in the region R where the two decoupling laminated ceramic capacitors 10 are disposed are significantly reduced or prevented, which makes it possible to significantly reduce or prevent the occurrence of noise as a result (a detailed description thereof will be omitted here to avoid repetition).

Furthermore, by disposing the two decoupling laminated ceramic capacitors 10 near or adjacent to the IC 20 as described above, not only is an increase in the size of the circuit board 1G prevented, but loop inductance in the circuit located on the wiring board 2 is also reduced.

Accordingly, by configuring a decoupling circuit using the configuration of the circuit board 1G according to the seventh configuration example, the occurrence of noise is significantly reduced or prevented while preventing an increase in the size of the electronic device. Although the present seventh configuration example describes an example in which the two decoupling laminated ceramic capacitors 10 and the IC 20 are disposed so as to be arranged along the same straight line, the elements may instead be disposed so that a direction in which the two decoupling laminated ceramic capacitors 10 are arranged and a direction in which the capacitor element group including the two decoupling capacitors 10 and the IC 20 are arranged intersect with each other.

Furthermore, although FIG. 15 depicts the outer dimensions of the lands 3 along the width direction W of the decoupling laminated ceramic capacitors 10 as being greater than the outer dimension of the laminated ceramic capacitors 10 in the width direction W thereof for easier visual understanding, these dimensions are actually the same in the present seventh configuration example.

Eighth Configuration Example

Figure 16:
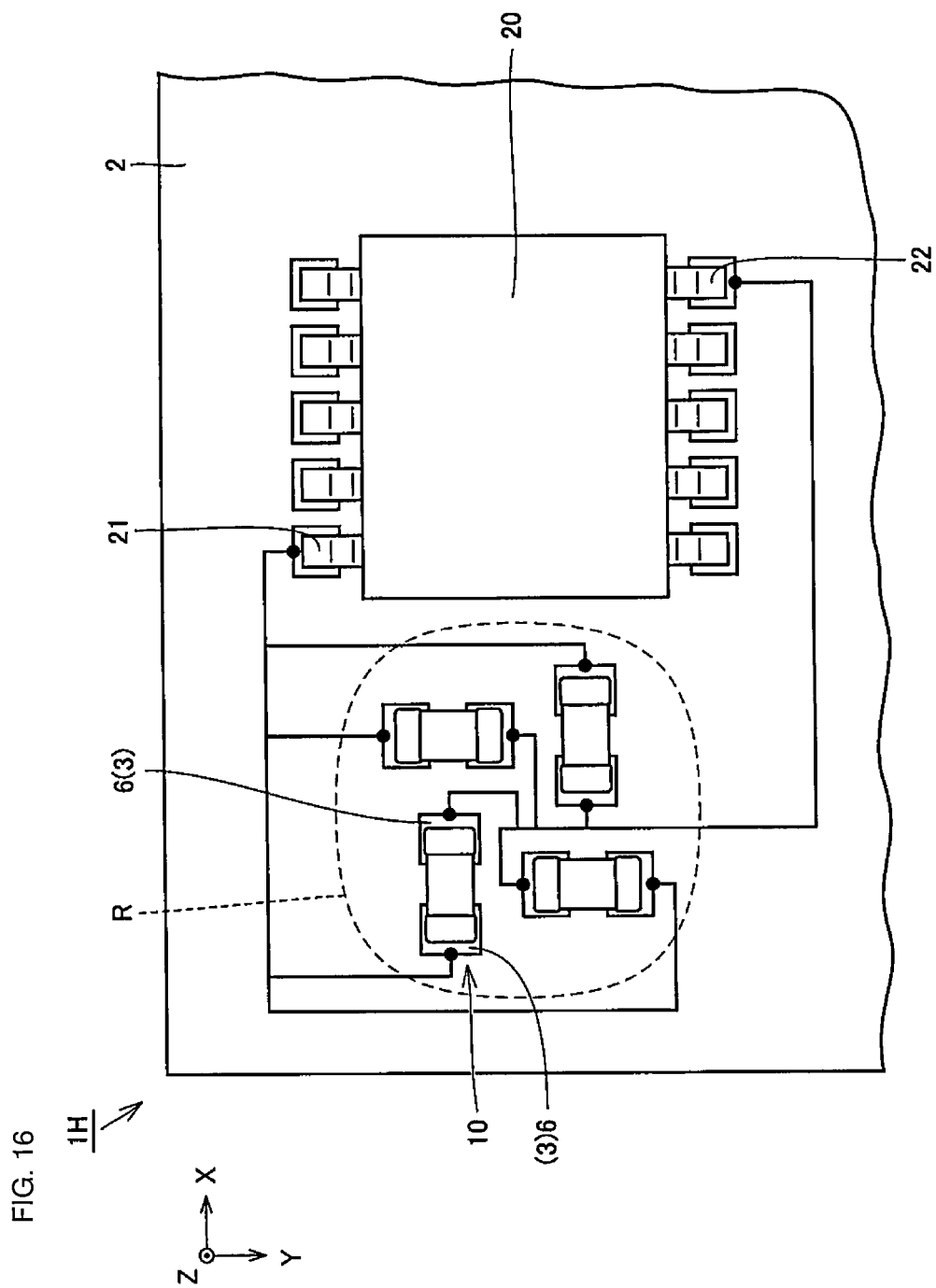
FIG. 16 is a schematic plan view illustrating a layout of laminated ceramic capacitors and an IC provided on a circuit board according to an eighth configuration example.

FIG. 16 is a schematic plan view illustrating a layout of laminated ceramic capacitors and an IC provided on a circuit board according to an eighth configuration example.

As shown in FIG. 16, a circuit board 1H according to the present eighth configuration example includes the wiring board 2, the IC 20 mounted on the wiring board 2, and a capacitor element group including the four decoupling laminated ceramic capacitors 10 that are connected to the IC by being mounted on the wiring board 2; the layout of the first laminated ceramic capacitor 10A, the second laminated ceramic capacitor 10B, the third laminated ceramic capacitor 10C, and the fourth laminated ceramic capacitor 10D on the circuit board 1C according to the aforementioned third configuration example is applied to the layout of the four decoupling laminated ceramic capacitors 10. Here, the four decoupling laminated ceramic capacitors 10 include a set of capacitors having a high capacity, a medium capacity, and a low capacity, where two of the laminated ceramic capacitors 10 having the same capacity correspond to the high-capacity capacitors and the other two laminated ceramic capacitors 10 correspond to the medium-capacity and the low-capacity capacitors respectively.

More specifically, like the aforementioned seventh configuration example, the IC 20 includes a plurality of terminals for input/output from/to external circuits, and the power source terminal 21 and the ground terminal 22 are included in that plurality of terminals. The aforementioned four decoupling laminated ceramic capacitors 10 are disposed on the main surface of the wiring board 2 on which the IC 20 is mounted, near the IC 20, and arranged along a direction parallel or substantially parallel to the main surface. Here, more preferably, the capacitor element group including the four decoupling laminated ceramic capacitors 10 and the IC 20 are disposed so that no other elements (electronic components or the like) are positioned therebetween, as illustrated in FIG. 16.

The lands 3 respectively connected via the joining members 6 to outer electrodes provided in each of the four decoupling laminated ceramic capacitors 10 are connected to the power source terminal 21 and the ground terminal 22 of the IC 20 via interconnects. Through this, the four decoupling laminated ceramic capacitors 10 are electrically connected in parallel between the power source terminal 21 and the ground terminal 22.

As described above, with the circuit board 1H according to the eighth configuration example, the layout of the first laminated ceramic capacitor 10A, the second laminated ceramic capacitor 10B, the third laminated ceramic capacitor 10C, and the fourth laminated ceramic capacitor 10D on the circuit board 1C described in the aforementioned third configuration example is applied to the layout of the four decoupling laminated ceramic capacitors 10. By using such a configuration, vibrations produced in the region R where the four decoupling laminated ceramic capacitors 10 are disposed are significantly reduced or prevented, which makes it possible to reduce the occurrence of noise as a result (a detailed description thereof will be omitted here to avoid repetition).

Furthermore, by disposing the four decoupling laminated ceramic capacitors 10 near the IC 20 as described above, not only is an increase in the size of the circuit board 1H prevented, but loop inductance in the circuit located on the wiring board 2 is also reduced.

Accordingly, by configuring a decoupling circuit using the configuration of the circuit board 1H according to the eighth configuration example, the occurrence of noise is significantly reduced or prevented while preventing an increase in the size of the electronic device.

Note that although FIG. 16 depicts the outer dimensions of the lands 3 along the width direction W of the decoupling laminated ceramic capacitors 10 as being greater than the outer dimension of the laminated ceramic capacitors 10 in the width direction W thereof for easier visual understanding, these dimensions are actually the same in the present eighth configuration example.

Verification Tests

The following describes verification tests carried out to confirm the effects of various preferred embodiments of the present invention. The verification tests include first, third, and fourth verification tests that verified how a sound pressure level of noise produced when a voltage is applied changes when varying the mounting layout of the laminated ceramic capacitors on the wiring board, when varying the mounting structure of the laminated ceramic capacitors on the wiring board, and when varying the type of laminated ceramic capacitors mounted on the wiring board, as well as a second verification test that verified how the sound pressure level of the noise produced when a voltage is applied changes when varying the dimensions of the lands provided on the wiring board (and more specifically, the dimensions of the distances D1 and D2 indicated in FIG. 9).

First Verification Test

FIGS. 17A to 17F are diagrams illustrating mounting layouts for the laminated ceramic capacitors according to first to third comparative examples and first to third examples verified in the first verification test. In the first verification test, circuit boards in which the laminated ceramic capacitor mounting layouts illustrated in FIGS. 17A to 17F are applied were prepared as samples, a voltage was actually applied to the samples, and the sound pressure level of noise produced at that time was measured.

Note that all of the laminated ceramic capacitors 10 in the samples prepared for the first verification test were mounted on the wiring board 2 so that the thickness directions T thereof were parallel or substantially parallel to the normal direction of the main surface of the wiring board 2 and so that the length directions L and width directions W thereof were parallel to the main surface of the wiring board 2. In other words, the mounting structures were such that all of the laminated ceramic capacitors 10 were in a relationship where the internal electrode layers thereof were parallel to the main surface of the wiring board 2 after mounting, and in FIGS. 17A to 17F, the letter H has been added in parentheses following a reference numeral 10 indicating the laminated ceramic capacitor as a sign indicating this structure.

As shown in FIG. 17A, in a mounting layout according to the first comparative example, a single laminated ceramic capacitor 10 was mounted on the main surface of the wiring board 2. The orientation of the single mounted laminated ceramic capacitor 10 was such that the length direction L thereof matched the X axis direction of the wiring board 2 and the width direction W thereof matched the Y axis direction of the wiring board 2.

As shown in FIG. 17B, in a mounting layout according to the second comparative example, two laminated ceramic capacitors 10 were mounted on the main surface of the wiring board 2. Both the orientations of the two mounted laminated ceramic capacitors 10 were such that the length directions L thereof matched the X axis direction of the wiring board 2 and the width directions W thereof matched the Y axis direction of the wiring board 2. Note that these two laminated ceramic capacitors 10 were disposed near or adjacent to each other on the main surface of the wiring board 2.

As shown in FIG. 17C, in a mounting layout according to the third comparative example, the four laminated ceramic capacitors 10 were mounted on the main surface of the wiring board 2. All the orientations of the four mounted laminated ceramic capacitors 10 were such that the length directions L thereof matched the X axis direction of the wiring board 2 and the width directions W thereof matched the Y axis direction of the wiring board 2. Note that these four laminated ceramic capacitors 10 were disposed near or adjacent to each other on the main surface of the wiring board 2.

As shown in FIG. 17D, in a mounting layout according to the first example, the two laminated ceramic capacitors 10 were mounted on the main surface of the wiring board 2. The mounting layout according to the first example followed the first configuration example based on the preferred embodiment described above.

As shown in FIG. 17E, in a mounting layout according to the second example, the four laminated ceramic capacitors 10 were mounted on the main surface of the wiring board 2. The mounting layout according to the second example took the mounting layout according to the first configuration example based on the preferred embodiment described above as a unit layout pattern, and disposed two of the unit layout patterns along the X axis direction. Note that the two unit layout patterns were disposed near or adjacent to each other on the main surface of the wiring board 2.

As shown in FIG. 17F, in a mounting layout according to the third example, the four laminated ceramic capacitors 10 were mounted on the main surface of the wiring board 2. The mounting layout according to the third example followed the third configuration example based on the preferred embodiment described above.

The laminated ceramic capacitors 10 used in the first to third comparative examples and the first to third examples all had the same design specifications. More specifically, the outer dimensions of each laminated ceramic capacitor 10 in the length direction L, width direction W, and thickness direction T thereof were about 0.6 mm×0.3 mm×0.3 mm, and the electrostatic capacities thereof were about 2.2 µF, for example.

Meanwhile, in the second and third comparative examples and the first to third examples, the plurality of laminated ceramic capacitors were electrically connected in parallel. Furthermore, with respect to the dimensions of the lands provided on the wiring board 2, the distance D1 indicated in FIG. 9 (that is, the distance, along the length direction L of the laminated ceramic capacitors 10, between both end portions of the pair of lands provided for a single laminated ceramic capacitor 10) was about 0.7 mm, and the outer dimension in the width direction thereof was about 0.3 mm, for example. Further still, the distances between the adjacent laminated ceramic capacitors 10 were all about 0.3 mm, for example. Note that FIGS. 17A to 17F depict the outer dimensions of the lands along the width direction thereof as being greater than the outer dimension of the laminated ceramic capacitors 10 in the width direction W thereof for easier visual understanding.

Figure 18:
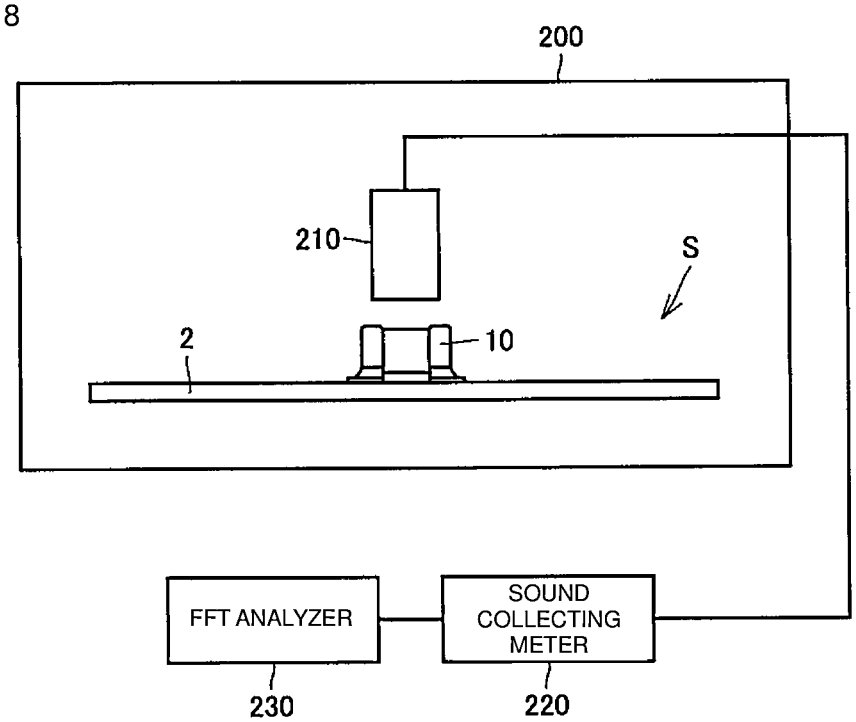
FIG. 18 is a schematic diagram illustrating a method for measuring a sound pressure level of noise according to the first verification test.

FIG. 18 is a schematic diagram illustrating a non-limiting example of a method for measuring the sound pressure level of noise according to the first verification test. As shown in FIG. 18, to measure the sound pressure level of noise, a sample S was placed in an anechoic box 200, an AC voltage at about 2 Vpp was then applied to the laminated ceramic capacitors 10 mounted on the wiring board 2 in a frequency range of about 4.5 kHz to about 5.0 kHz, for example, and a maximum value of noise produced at that time was measured.

Note that the sound pressure level of the noise was measured by placing a directional microphone 210 in the anechoic box 200 facing the sample S, collecting sound emitted from the sample S using the directional microphone 210 and a sound collecting meter 220, and based thereon, analyzing the sound pressure level using an FFT analyzer 230.

Furthermore, the wiring board 2 in each sample had a rectangular or substantially rectangular shape including long sides and short sides so that when measuring the sound pressure level of the noise, a sound pressure level of noise produced by vibrations along the X axis direction of the wiring board 2 and a sound pressure level of noise produced by vibrations along the Y axis direction of the wiring board 2 was able to be measured independently. In other words, in each of the first to third comparative examples and the first to third examples, a sample in which the long-side direction of the rectangular or substantially rectangular wiring board 2 matched the X axis direction and the length of the rectangular or substantially rectangular wiring board 2 in the short-side direction thereof matched the size of the mounting area of the laminated ceramic capacitors 10 in the Y axis direction was prepared in order to measure the sound pressure level of noise caused by vibrations along the X axis direction, a sample in which the long-side direction of the substantially rectangular wiring board 2 matched the Y axis direction and the length of the rectangular or substantially rectangular wiring board 2 in the short-side direction thereof matched the size of the mounting area of the laminated ceramic capacitors 10 in the X axis direction was prepared in order to measure the sound pressure level of noise caused by vibrations along the Y axis direction, and the sound pressure level of the noise was measured for each of these samples.

Figure 19:
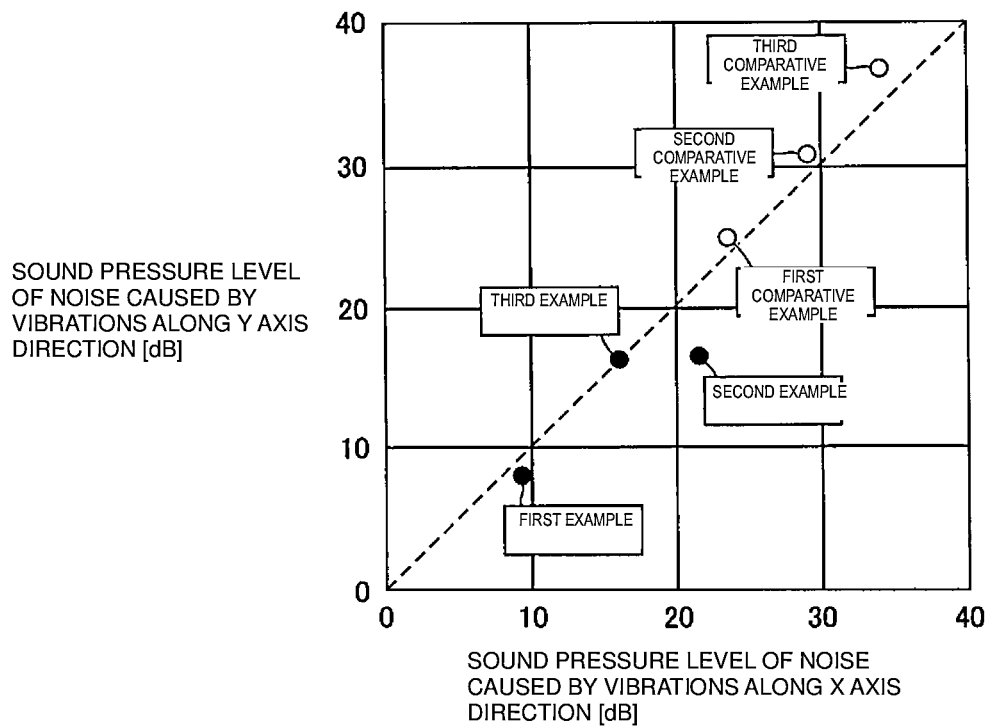
FIG. 19 is a graph illustrating a result of the first verification test.

FIG. 19 is a graph illustrating a result of the first verification test. In the graph shown in FIG. 19, the horizontal axis represents the sound pressure level (in dB) of noise produced by vibrations along the X axis direction, whereas the vertical axis represents the sound pressure level (in dB) of noise produced by vibrations along the Y axis direction.

As shown in FIG. 19, in the relationships between the first to third comparative examples, a tendency for the sound pressure level of the noise to increase as more laminated ceramic capacitors 10 were mounted was observed.

However, in the relationship between the second comparative example and the first example, in which the two laminated ceramic capacitors 10 were mounted, it was confirmed that the sound pressure level of noise was greatly reduced in the first example in which preferred embodiments of the present invention were applied as compared to the second comparative example in which preferred embodiments of the present invention were not applied; the sound pressure level of the noise measured in the first example was about 20 dB lower than the sound pressure level of the noise measured in the second comparative example.

In addition, the sound pressure level of noise measured in the first example, in which two laminated ceramic capacitors 10 were mounted, was confirmed to be even lower than the sound pressure level of noise measured in the first comparative example, in which only one laminated ceramic capacitor 10 was mounted; the sound pressure level of the noise measured in the first example was about 15 dB lower than the sound pressure level of the noise measured in the first comparative example.

Furthermore, in the relationship between the third comparative example, the second example, and the third example, in which the four laminated ceramic capacitors 10 were mounted, it was confirmed that the sound pressure level of noise was greatly reduced in the second and third examples in which the present invention were applied as compared to the third comparative example in which preferred embodiments of the present invention were not applied; the sound pressure level of the noise measured in the second and third examples was about 17 to 22 dB lower than the sound pressure level of the noise measured in the third comparative example.

In addition, in the relationship between the second and third examples, a major difference was not observed between the sound pressure levels of noise produced by vibrations along the Y axis direction, whereas a major difference was observed between the sound pressure levels of noise produced by vibrations along the X axis direction, and thus the third example was confirmed to be better than the second example at reducing the sound pressure level of noise produced by vibrations along the X axis direction. This is thought to be because with the mounting layout according to the third example, the adjacent laminated ceramic capacitors of the four laminated ceramic capacitors 10 are all in the relationship indicated by the first laminated ceramic capacitor 10A and the second laminated ceramic capacitor 10B in the aforementioned first configuration example, and thus the vibration modes produced in the wiring board 2 along the X axis direction and the Y axis direction transmit vibrations toward each other, resulting in a more efficient vibration cancellation effect being obtained.

Based on the first verification test as described thus far, it can be said that applying preferred embodiments of the present invention has been experimentally confirmed to be capable of reducing noise while preventing an increase in the size of the circuit board.

Second Verification Test

In a second verification test, a plurality of samples in which a single laminated ceramic capacitor was mounted on a square or substantially square wiring board were prepared, and the sound pressure level of noise produced in these samples was measured using the same measurement method as the method for measuring the sound pressure level of noise described in the aforementioned first verification test. Note that an AC voltage at about 2 Vpp was applied to the laminated ceramic capacitors mounted on the wiring boards in a frequency range of about 4.5 kHz to 5.0 kHz, for example, and a maximum value of noise produced at that time was measured.

Two types of samples were prepared. In a first sample, a laminated ceramic capacitor whose outer dimensions in the length direction L, width direction W, and thickness direction T were approximately 0.6 mm×0.3 mm×0.3 mm and whose electrostatic capacity was about 2.2 µF was mounted on the wiring board, whereas in a second sample, a laminated ceramic capacitor whose outer dimensions in the length direction L, width direction W, and thickness direction T were approximately 1.0 mm×0.5 mm×0.5 mm and whose electrostatic capacity was about 10 µF was mounted on the wiring board, for example.

Meanwhile, with respect to the dimensions of the lands provided on the wiring board 2 for the first sample, samples in which the distance D1 indicated in FIG. 9 (that is, the distance, along the length direction L of the laminated ceramic capacitor 10, between both end portions of the pair of lands provided for the laminated ceramic capacitor) was set to about 0.7 mm, about 0.8 mm, and about 0.9 mm, for example, were prepared. Note that the outer dimensions of the lands in the width direction thereof were set to about 0.3 mm, for example, for each of these, and three samples for each length of the distance D1 were prepared.

On the other hand, with respect to the dimensions of the lands provided on the wiring board 2 for the second sample, samples in which the distance D1 indicated in FIG. 9 (that is, the distance, along the length direction L of the laminated ceramic capacitor 10, between both end portions of the pair of lands provided for the laminated ceramic capacitor) was set to about 1.2 mm, about 1.3 mm, and about 1.5 mm, for example, were prepared. Note that the outer dimensions of the lands in the width direction thereof were set to about 0.5 mm, for example, for each of these, and three samples for each length of the distance D1 were prepared.

Figure 20A:
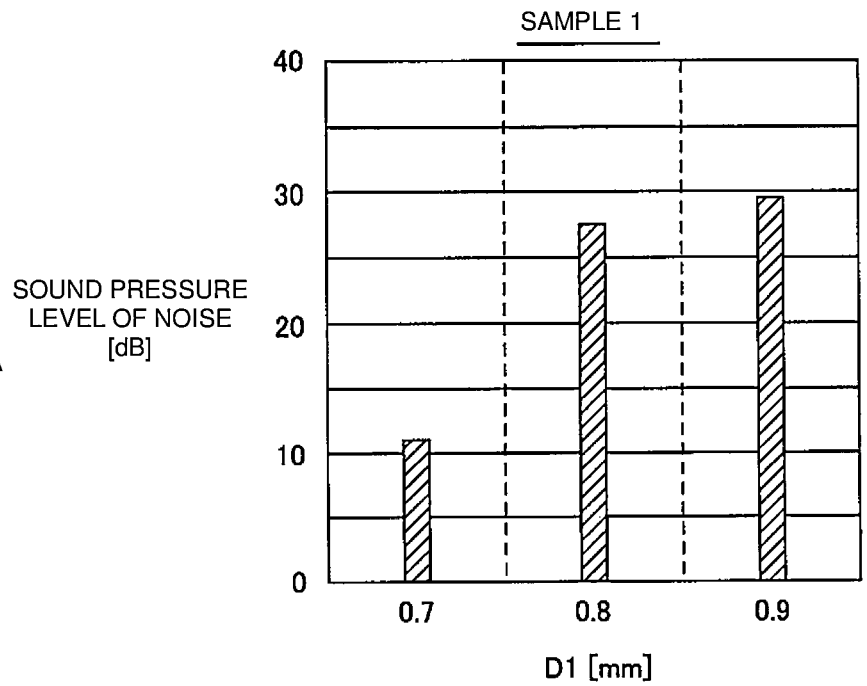
FIGS. 20A and 20B are graphs illustrating a result of a second verification test.
Figure 20B:
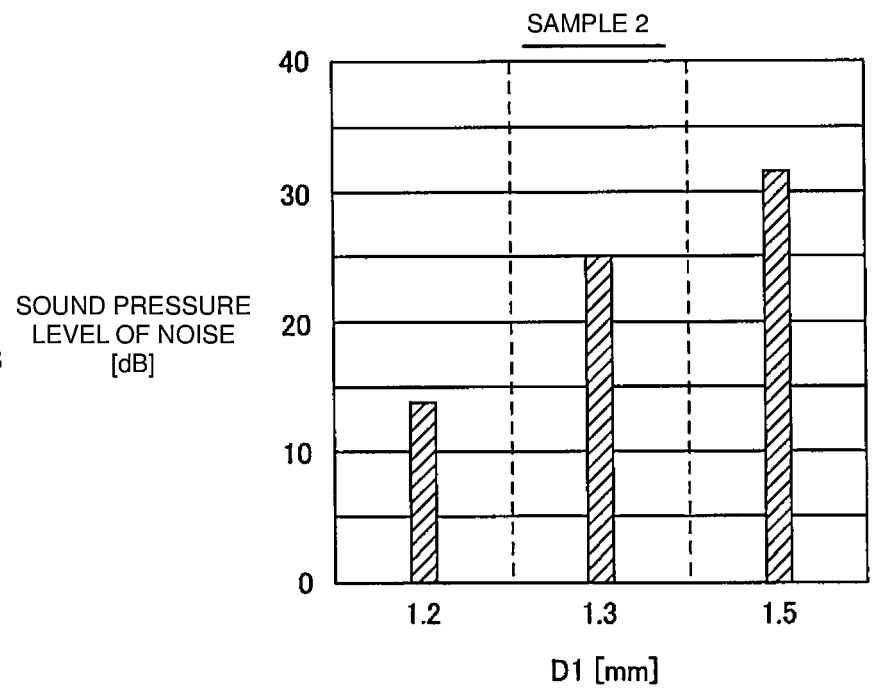

FIGS. 20A and 20B are graphs illustrating results of the second verification test, where FIG. 20A illustrates results obtained for the first sample and FIG. 20B illustrates results obtained for the second sample. In the graphs shown in FIGS. 20A and 20B, the horizontal axis represents the sample type, whereas the vertical axis represents the sound pressure level of the noise (in dB). Note that the sound pressure levels of the noise shown in the graphs correspond to average values for each sample type.

As shown in FIGS. 20A and 20B, it was confirmed that the sound pressure level of the noise decreased as the distance D1 decreased, in both the first and second samples.

With respect to the first sample, it can be seen from FIG. 20A that the sound pressure level of the noise was about 2 dB lower when the distance D1 was about 0.8 mm than when the distance D1 was about 0.9 mm, and the sound pressure level of the noise was about 19 dB lower when the distance D1 was about 0.7 mm than when the distance D1 was about 0.9 mm, for example.

On the other hand, with respect to the second sample, it can be seen from FIG. 20B that the sound pressure level of the noise was about 7 dB lower when the distance D1 was about 1.3 mm than when the distance D1 was about 1.5 mm, and the sound pressure level of the noise was about 18 dB lower when the distance D1 was about 1.2 mm than when the distance D1 was about 1.5 mm, for example.

Based on the second verification test as described thus far, it can be said that it was experimentally confirmed that when applying preferred embodiments of the present invention, it is generally preferable for the distance D1 to be set to no more than about 1.3 times the length L1 along the length direction L of the laminated ceramic capacitor (see FIG. 7), and particularly preferable to be set to no more than about 1.2 times the length L1.

Third Verification Test

Although the aforementioned preferred embodiments of the present invention relate to an example of a mounting structure in which the plurality of laminated ceramic capacitors are mounted on the wiring board so that the thickness directions T thereof are parallel or substantially parallel to the normal direction of the main surface of the wiring board and the length directions L and width directions W thereof are parallel or substantially parallel to the main surface of the wiring board, the present invention is not limited to cases where such a mounting structure is used. That is, the mounting structure may be such that the plurality of laminated ceramic capacitors are mounted on the wiring board so that the width directions W thereof are parallel or substantially parallel to the normal direction of the main surface of the wiring board and the length directions L and thickness directions T thereof are parallel or substantially parallel to the main surface of the wiring board, and these mounting structures may be used in combination with each other. The present third verification test verified how the sound pressure level of noise produced when a voltage is applied changes among several such configurations.

FIGS. 21A to 21E are diagrams illustrating mounting layouts for the laminated ceramic capacitors according to fourth to sixth comparative examples and fourth and fifth examples verified in the third verification test. In the third verification test, circuit boards in which the laminated ceramic capacitor mounting layouts illustrated in FIGS. 21A to 21E are applied were prepared as samples, a voltage was actually applied to the samples, and the sound pressure level of noise produced at that time was measured.

Note that the laminated ceramic capacitors 10 in the samples prepared for the third verification test included laminated ceramic capacitors mounted on the wiring board 2 so that the width directions W thereof were parallel or substantially parallel to the normal direction of the main surface of the wiring board 2 and so that the length directions L and width directions W thereof were parallel or substantially parallel to the main surface of the wiring board 2 and laminated ceramic capacitors mounted on the wiring board 2 so that the thickness directions T thereof were parallel or substantially parallel to the normal direction of the main surface of the wiring board 2 and so that the length directions L and width directions W thereof were parallel or substantially parallel to the main surface of the wiring board 2. With respect to the former laminated ceramic capacitors 10, the mounting structures were such that all of the laminated ceramic capacitors 10 were in a relationship where the internal electrode layers thereof were perpendicular or substantially perpendicular to the main surface of the wiring board 2 after mounting, and in FIGS. 21A to 21E, the letter V has been added in parentheses following the reference numeral 10 indicating the laminated ceramic capacitor as a sign indicating this structure. On the other hand, with respect to the latter laminated ceramic capacitors 10, the mounting structures were such that all of the laminated ceramic capacitors 10 were in a relationship where the internal electrode layers thereof were parallel or substantially parallel to the main surface of the wiring board 2 after mounting, and in FIGS. 21A to 21E, the letter H has been added in parentheses following the reference numeral 10 indicating the laminated ceramic capacitor as a sign indicating this structure.

Figure 21A:
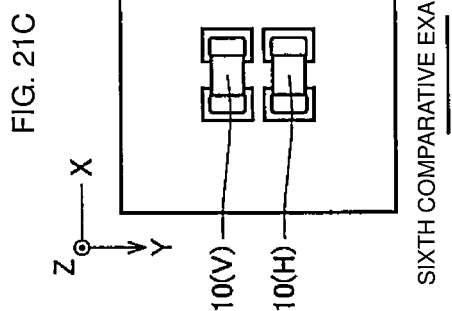
FIGS. 21A to 21E are diagrams illustrating mounting layouts for the laminated ceramic capacitors according to fourth to sixth comparative examples and fourth and fifth examples verified in a third verification test.

As shown in FIG. 21A, in a mounting layout according to the fourth comparative example, a single laminated ceramic capacitor 10 was mounted on the main surface of the wiring board 2. The orientation of the single mounted laminated ceramic capacitor 10 was such that the length direction L thereof matched the X axis direction of the wiring board 2 and the thickness direction T thereof matched the Y axis direction of the wiring board 2.

Figure 21B:
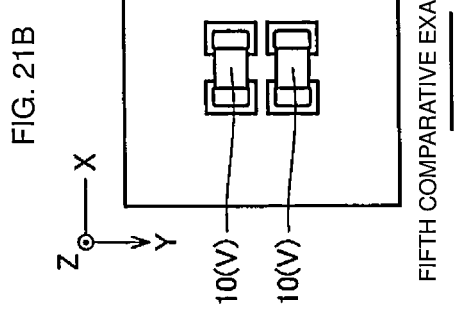

As shown in FIG. 21B, in a mounting layout according to the fifth comparative example, two laminated ceramic capacitors 10 were mounted on the main surface of the wiring board 2. Both the orientations of the two mounted laminated ceramic capacitors 10 were such that the length directions L thereof matched the X axis direction of the wiring board 2 and the thickness directions T thereof matched the Y axis direction of the wiring board 2. Note that these two laminated ceramic capacitors 10 were disposed near or adjacent to each other on the main surface of the wiring board 2.

Figure 21C:
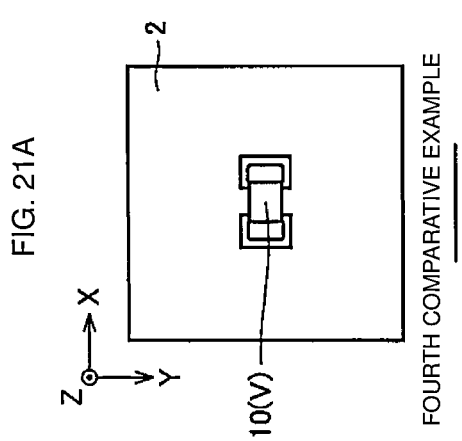

As shown in FIG. 21C, in a mounting layout according to the sixth comparative example, two laminated ceramic capacitors 10 were mounted on the main surface of the wiring board 2. Of the two mounted laminated ceramic capacitors 10, the orientation of one laminated ceramic capacitor 10 was such that the length direction L thereof matched the X axis direction of the wiring board 2 and the thickness direction T thereof matched the Y axis direction of the wiring board 2, and the orientation of the other laminated ceramic capacitor 10 was such that the length direction L thereof matched the X axis direction of the wiring board 2 and the width direction W thereof matched the Y axis direction of the wiring board 2. Note that these two laminated ceramic capacitors 10 were disposed near or adjacent to each other on the main surface of the wiring board 2.

Figure 21D:
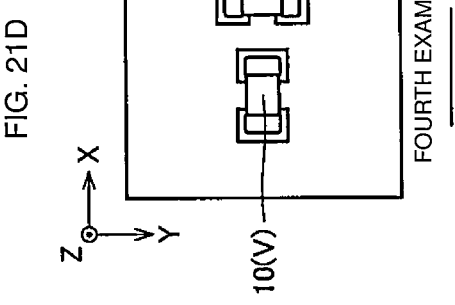

As shown in FIG. 21D, in a mounting layout according to the fourth example, two laminated ceramic capacitors 10 were mounted on the main surface of the wiring board 2. When the mounting layout according to the fourth example is viewed from above, the layout pattern followed that described in the aforementioned first configuration example based on one of the preferred embodiments of the present invention. However, of the two mounted laminated ceramic capacitors 10, the orientation of one laminated ceramic capacitor 10 was such that the length direction L thereof matched the X axis direction of the wiring board 2 and the thickness direction T thereof matched the Y axis direction of the wiring board 2, and the orientation of the other laminated ceramic capacitor 10 was such that the length direction L thereof matched the Y axis direction of the wiring board 2 and the thickness direction T thereof matched the X axis direction of the wiring board 2.

Figure 21E:
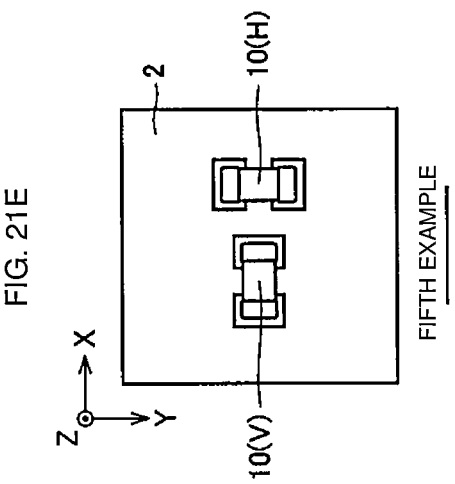

As shown in FIG. 21E, in a mounting layout according to the fifth example, two laminated ceramic capacitors 10 were mounted on the main surface of the wiring board 2. When the mounting layout according to the fifth example is viewed from above, the layout pattern followed that described in the aforementioned first configuration example based on one of the preferred embodiments of the present invention. However, of the two mounted laminated ceramic capacitors 10, the orientation of one laminated ceramic capacitor 10 was such that the length direction L thereof matched the X axis direction of the wiring board 2 and the thickness direction T thereof matched the Y axis direction of the wiring board 2, and the orientation of the other laminated ceramic capacitor 10 was such that the length direction L thereof matched the Y axis direction of the wiring board 2 and the width direction W thereof matched the X axis direction of the wiring board 2.

The laminated ceramic capacitors 10 used in the fourth to sixth comparative examples and the fourth and fifth examples all had the same design specifications. More specifically, the outer dimensions of each laminated ceramic capacitor 10 in the length direction L, width direction W, and thickness direction T thereof were approximately 0.6 mm×0.3 mm×0.3 mm, and the electrostatic capacities thereof were about 1.0 μF, for example.

Meanwhile, in the fifth and sixth comparative examples and the fourth and fifth examples, the plurality of laminated ceramic capacitors were electrically connected in parallel. Furthermore, with respect to the dimensions of the lands provided on the wiring board 2, the distance D1 indicated in FIG. 9 (that is, the distance, along the length direction L of the laminated ceramic capacitors 10, between both end portions of the pair of lands provided for a single laminated ceramic capacitor 10) was about 0.7 mm, and the outer dimension in the width direction thereof was about 0.3 mm, for example. Further still, the distances between adjacent laminated ceramic capacitors 10 were all about 0.3 mm, for example. Note that FIGS. 21A to 21E depict the outer dimensions of the lands along the width direction thereof as being greater than the outer dimension of the laminated ceramic capacitors 10 in the width direction W thereof for easier visual understanding.

In the third verification test, the sound pressure level of noise produced in each of the samples was measured using the same measurement method as the method for measuring the sound pressure level of noise described in the aforementioned first verification test. Note that an AC voltage at about 2 Vpp was applied to the laminated ceramic capacitors 10 mounted on the wiring boards 2 in a frequency range of about 4.5 kHz to about 5.0 kHz, for example, and a maximum value of noise produced at that time was measured.

Figure 22:
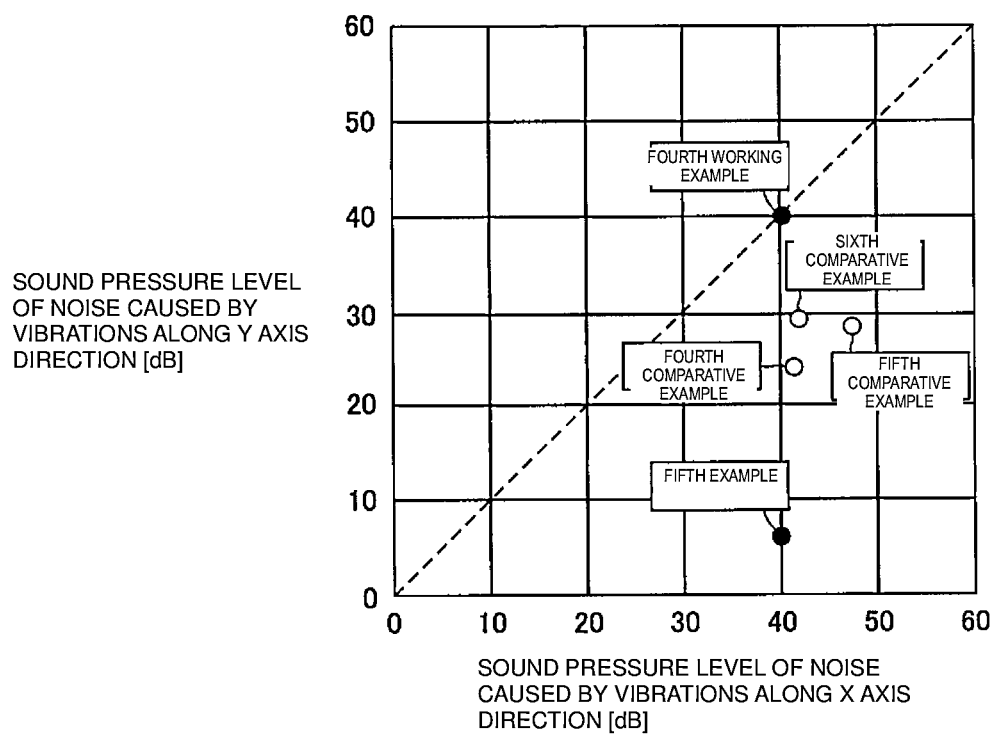
FIG. 22 is a graph illustrating a result of the third verification test.

FIG. 22 is a graph illustrating a result of the third verification test. In the graph shown in FIG. 22, the horizontal axis represents the sound pressure level (in dB) of noise produced by vibrations along the X axis direction, whereas the vertical axis represents the sound pressure level (in dB) of noise produced by vibrations along the Y axis direction.

As shown in FIG. 22, in the relationships between the fourth to sixth comparative examples, a tendency for the noise to increase when two laminated ceramic capacitors 10 were mounted as opposed to one laminated ceramic capacitor 10 being mounted was observed, and in all instances noise produced by vibrations along the X axis direction was more dominant than noise produced by vibrations along the Y axis direction.

On the other hand, in the relationship between the fifth comparative example and the fourth example, in which the internal electrode layers of the two mounted laminated ceramic capacitors 10 were perpendicular or substantially perpendicular to the main surface of the wiring board 2 after mounting, a lower sound pressure level of noise was confirmed in the fourth example, in which preferred embodiments of the present invention were applied, than in the fifth comparative example, in which preferred embodiments of the present invention were not applied; the sound pressure level of noise measured in the fourth example was about 7 dB lower than the sound pressure level of noise measured in the fifth comparative example.

Meanwhile, in the relationship between the sixth comparative example and the fifth example, in which the internal electrode layers in one of the two mounted laminated ceramic capacitors 10 were perpendicular or substantially perpendicular to the main surface of the wiring board 2 after mounting and the internal electrode layers of the other laminated ceramic capacitor 10 were parallel or substantially parallel to the main surface of the wiring board 2 after mounting, a lower sound pressure level of noise was confirmed in the fifth example, in which preferred embodiments of the present invention were applied, than in the sixth comparative example, in which preferred embodiments of the present invention were not applied; the sound pressure level of noise measured in the fifth example was about 2 dB lower than the sound pressure level of noise measured in the sixth comparative example.

Furthermore, a slight but noticeable reduction in the sound pressure level of noise produced by vibrations along the X axis direction was achieved by the fourth and fifth examples, in which preferred embodiments of the present invention were applied, over the fourth comparative example, despite two laminated ceramic capacitors 10 being mounted in the fourth and fifth examples and only one laminated ceramic capacitor 10 being mounted in the fourth comparative example.

Based on the third verification test as described above, it can be said to have been experimentally confirmed that applying preferred embodiments of the present invention significantly reduces or prevents noise while preventing an increase in the size of the circuit board by applying preferred embodiments of the present invention, both in the case where all of a plurality of laminated ceramic capacitors include a mounting structure in which the internal electrode layers thereof are perpendicular or substantially perpendicular to the main surface of the wiring board after mounting, and in the case where some of a plurality of laminated ceramic capacitors have a mounting structure in which the internal electrode layers thereof are perpendicular or substantially perpendicular to the main surface of the wiring board after mounting and the rest of the plurality of laminated ceramic capacitors include a mounting structure in which the internal electrode layers thereof are parallel or substantially parallel to the main surface of the wiring board after mounting.

Note that based on the third verification test, it can be seen that noise is significantly reduced or prevented not only in the X axis direction but also in the Y axis direction by using the same layout pattern as that of the layout seen when viewing the third configuration example based on the aforementioned preferred embodiments described above, even in the case where four laminated ceramic capacitors are disposed near or adjacent to each other on the wiring board and all of the four laminated ceramic capacitors include a mounting structure in which the internal electrode layers thereof are perpendicular or substantially perpendicular to the main surface of the wiring board after mounting, or some of the four laminated ceramic capacitors include a mounting structure in which the internal electrode layers thereof are perpendicular or substantially perpendicular to the main surface of the wiring board after mounting and the rest of the four laminated ceramic capacitors include a mounting structure in which the internal electrode layers thereof are parallel or substantially parallel to the main surface of the wiring board after mounting.

However, if the result of the present third verification test is taken into consideration along with the result of the aforementioned first verification test, it can be understood that in the case where preferred embodiments of the present invention are applied to a laminated ceramic capacitor group mounted on a wiring board, mounting all of the laminated ceramic capacitors so that the internal electrode layers thereof are parallel or substantially parallel to the main surface of the wiring board after mounting is preferable in terms of reducing vibrations.

Fourth Verification Test

Although the aforementioned preferred embodiments of the present invention relates to an example in which laminated ceramic capacitors having the same design specifications (the same capacities and the same sizes) are mounted onto the wiring board as the plurality of laminated ceramic capacitors, the plurality of laminated ceramic capacitors may have different design specifications. For example, the pair of laminated ceramic capacitors mounted on the circuit board 1A according to the aforementioned first configuration example may be configured with mutually different capacities. Furthermore, for example, in the aforementioned second configuration example, a pair of laminated ceramic capacitors having the same design specifications (the same capacities and the same sizes) can be taken as a single laminated ceramic capacitor group, a plurality of such laminated ceramic capacitor groups can be provided, and the design specifications can be varied among the laminated ceramic capacitor groups. Likewise, the four laminated ceramic capacitors mounted on the circuit board 1C according to the aforementioned third configuration example may be configured to include two or more difference capacities; and in the aforementioned fourth configuration example, four laminated ceramic capacitors having the same design specifications (the same capacities and the same sizes) can be taken as a single laminated ceramic capacitor group, a plurality of such laminated ceramic capacitor groups can be provided, and the design specifications can be varied among the laminated ceramic capacitor groups. The present fourth verification test verified how the sound pressure level of noise produced when a voltage is applied changes among several such configurations.

Figure 23A:
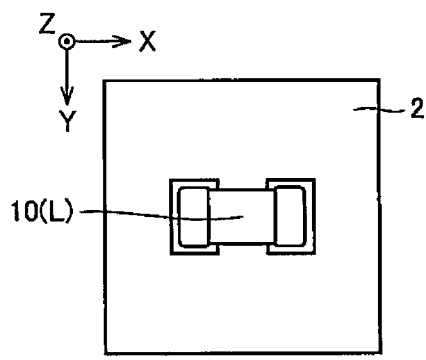
FIGS. 23A to 23C are diagrams illustrating mounting layouts for the laminated ceramic capacitors according to seventh and eighth comparative examples and a sixth example verified in a fourth verification test.
Figure 23B:
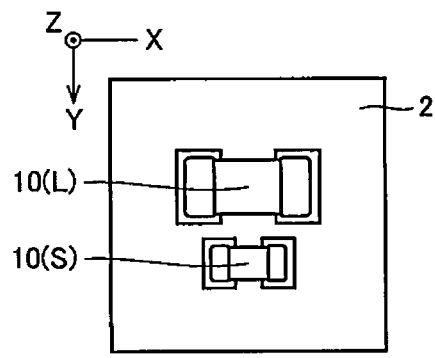
Figure 23C:
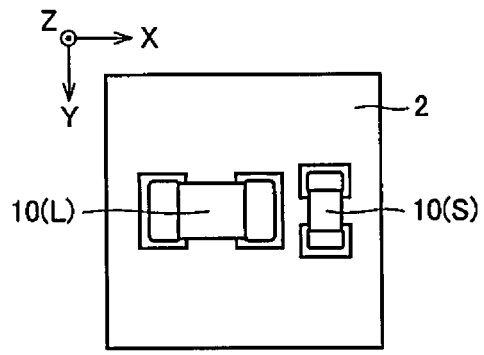

FIGS. 23A to 23C are diagrams illustrating mounting layouts for the laminated ceramic capacitors according to seventh and eighth comparative examples and a sixth example verified in the fourth verification test. In the fourth verification test, circuit boards in which the laminated ceramic capacitor mounting layouts illustrated in FIGS. 23A to 23C were applied were prepared as samples, a voltage was actually applied to the samples, and the sound pressure level of noise produced at that time was measured.

Note that all of the laminated ceramic capacitors 10 in the samples prepared for the fourth verification test were mounted on the wiring board 2 so that the thickness directions T thereof were parallel or substantially parallel to the normal direction of the main surface of the wiring board 2 and so that the length directions L and width directions W thereof were parallel or substantially parallel to the main surface of the wiring board 2; however, the samples in the eighth comparative example and the sixth example included laminated ceramic capacitors having different design specifications (capacities and sizes). Specifically, capacitors having high capacities and large sizes and capacitors having low capacities and small sizes were included, and in FIGS. 23A to 23C, the letter L has been added in parentheses following the reference numeral 10 indicating the laminated ceramic capacitor as a sign indicating the former, and the letter S has been added in parentheses following the reference numeral 10 indicating the laminated ceramic capacitor as a sign indicating the latter.

As shown in FIG. 23A, in a mounting layout according to the seventh comparative example, a single high-capacity, large-size laminated ceramic capacitor 10 was mounted on the main surface of the wiring board 2. The orientation of the single mounted laminated ceramic capacitor 10 was such that the length direction L thereof matched the X axis direction of the wiring board 2 and the width direction W thereof matched the Y axis direction of the wiring board 2.

As shown in FIG. 23B, in a mounting layout according to the eighth comparative example, a high-capacity, large-size laminated ceramic capacitor 10 and a low-capacity, small-size laminated ceramic capacitor 10 were mounted on the main surface of the wiring board 2, for a total of two laminated ceramic capacitors 10. Both the orientations of the two mounted laminated ceramic capacitors 10 were such that the length directions L thereof matched the X axis direction of the wiring board 2 and the width directions W thereof matched the Y axis direction of the wiring board 2. Note that these two laminated ceramic capacitors 10 were disposed near or adjacent to each other on the main surface of the wiring board 2.

As shown in FIG. 23C, in a mounting layout according to the sixth example, a high-capacity, large-size laminated ceramic capacitor 10 and a low-capacity, small-size laminated ceramic capacitor 10 were mounted on the main surface of the wiring board 2, for a total of two laminated ceramic capacitors 10. When the mounting layout according to the sixth example is viewed from above, the layout pattern followed that described in the aforementioned first configuration example based on the preferred embodiments of the present invention. However, of the two mounted laminated ceramic capacitors 10, the orientation of the larger laminated ceramic capacitor 10 was such that the length direction L thereof matched the X axis direction of the wiring board 2 and the thickness direction T thereof matched the Y axis direction of the wiring board 2, and the orientation of the smaller laminated ceramic capacitor 10 was such that the length direction L thereof matched the Y axis direction of the wiring board 2 and the width direction W thereof matched the X axis direction of the wiring board 2.

The laminated ceramic capacitor 10 used in the seventh comparative example and the larger laminated ceramic capacitors 10 used in the eighth comparative example and the sixth example had outer dimensions in the length direction L, width direction W, and thickness direction T of about 1.0 mm×0.5 mm×0.5 mm, and had an electrostatic capacity of about 2.2 µF, for example. On the other hand, the smaller laminated ceramic capacitors 10 used in the eighth comparative example and the sixth example had outer dimensions in the length direction L, width direction W, and thickness direction T of about 0.6 mm×0.3 mm×0.3 mm, and had an electrostatic capacity of about 1.0 µF, for example.

Meanwhile, in the eighth comparative example and the sixth example, the plurality of laminated ceramic capacitors were electrically connected in parallel. Furthermore, with respect to the dimensions of the lands provided on the wiring board 2, the distance D1 indicated in FIG. 9 (that is, the distance, along the length direction L of the laminated ceramic capacitors 10, between both end portions of the pair of lands provided for a single laminated ceramic capacitor 10) was about 1.2 mm for the lands corresponding to the larger laminated ceramic capacitors and about 0.7 mm for the lands corresponding to the smaller laminated ceramic capacitors, and the outer dimension in the width directions thereof was about 0.5 mm for the lands corresponding to the larger laminated ceramic capacitors and about 0.3 mm for the lands corresponding to the smaller laminated ceramic capacitors, for example. Further still, the distances between adjacent laminated ceramic capacitors 10 were all about 0.3 mm, for example. Note that FIGS. 23A to 23C depict the outer dimensions of the lands along the width direction thereof as being greater than the outer dimension of the laminated ceramic capacitors 10 in the width direction W thereof for easier visual understanding.

In the fourth verification test, the sound pressure level of noise produced in the samples was measured using the same measurement method as the method for measuring the sound pressure level of noise described in the aforementioned first verification test. Note that an AC voltage at about 2 Vpp was applied to the laminated ceramic capacitors 10 mounted on the wiring boards 2 in a frequency range of about 4.5 kHz to about 5.0 kHz, for example, and a maximum value of noise produced at that time was measured.

Figure 24:
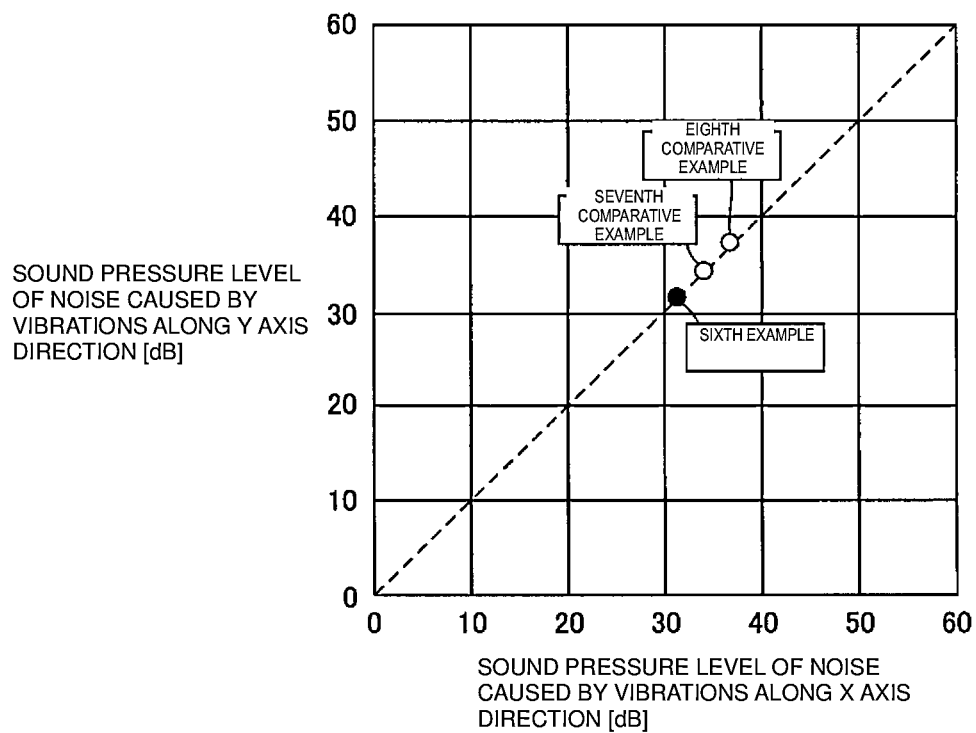
FIG. 24 is a graph illustrating a result of the fourth verification test.

FIG. 24 is a graph illustrating a result of the fourth verification test. In the graph shown in FIG. 24, the horizontal axis represents the sound pressure level (in dB) of noise produced by vibrations along the X axis direction, whereas the vertical axis represents the sound pressure level (in dB) of noise produced by vibrations along the Y axis direction.

As shown in FIG. 24, in the relationship between the seventh and eighth comparative examples, a tendency for the noise to increase when a total of two laminated ceramic capacitors each having different capacities and sizes were mounted as opposed to only one laminated ceramic capacitor 10 being mounted was observed.

On the other hand, in the relationship between the eighth comparative example and the sixth example, in which a total of two laminated ceramic capacitors that each have different capacities and sizes were mounted, a lower sound pressure level of noise was confirmed in the sixth example, in which the present invention was applied, than in the eighth comparative example, in which preferred embodiments of the present invention were not applied; the sound pressure level of noise measured in the sixth example was about 5 dB lower than the sound pressure level of noise measured in the eighth comparative example.

Furthermore, despite two laminated ceramic capacitors 10 being mounted, the sixth example, in which preferred embodiments of the present invention were applied, was confirmed to reduce the sound pressure level of noise over the seventh comparative example, in which only one laminated ceramic capacitor 10 was mounted; the sound pressure level of noise measured in the sixth example was about 3 dB lower than the sound pressure level of noise measured in the seventh comparative example.

Based on the fourth verification test as described thus far, it can be said that applying preferred embodiments of the present invention has been experimentally confirmed to be capable of reducing noise while preventing an increase in the size of the circuit board, even in the case where a plurality of laminated ceramic capacitors having difference capacities and sizes are intermixed.

Note that based on the fourth verification test, it can be seen that noise is significantly reduced or prevented by using the same layout pattern as that of the layout seen when viewing the third configuration example based on the aforementioned preferred embodiments described above, even in the case where four laminated ceramic capacitors are disposed near or adjacent to each other on the wiring board and the four laminated ceramic capacitors include laminated ceramic capacitors having difference capacities and sizes.

However, if the result of the present fourth verification test is taken into consideration along with the result of the aforementioned first verification test, it can be understood that in the case where preferred embodiments of the present invention are applied to a laminated ceramic capacitor group mounted on a wiring board, it is preferable, in terms of reducing vibrations, for all of the laminated ceramic capacitors to have the same design specifications (the same capacities and the same sizes).

The laminated ceramic capacitor layouts for the circuit boards according to the aforementioned first through eighth configuration examples based on the preferred embodiments of the present invention are layouts capable of significantly reducing or preventing noise while preventing an increase in the size of the circuit board without being restricted by the capacities, sizes, and so on of the laminated ceramic capacitors mounted on the wiring board. However, because the sound pressure level of noise normally tends to increase as the capacity of the laminated ceramic capacitor increases, various preferred embodiments of the present invention are useful in a case where the capacity of at least one of the capacitors in the laminated ceramic capacitor group mounted on the wiring board is no less than about 1 µF, and is particularly useful in a case where the capacity is no less than about 10 µF, for example.

Furthermore, although the aforementioned first to fourth configuration examples and the seventh and eighth configuration examples based on the preferred embodiments of the present invention describe examples where the outer dimensions of the lands along the width direction W of the laminated ceramic capacitors are the same as the outer dimensions of the laminated ceramic capacitors along the width direction W thereof, it is only necessary for the dimensions to be about the same, and the outer dimensions may differ slightly. Likewise, although the aforementioned fifth configuration example based on the preferred embodiments of the present invention describes an example where the outer dimensions of the lands along the length direction L of the laminated ceramic capacitors are the same as the outer dimensions of the laminated ceramic capacitors along the length direction L thereof, it is only necessary for the dimensions to be about the same, and the outer dimensions may differ slightly.

Furthermore, although the aforementioned seventh and eighth configuration examples based on the preferred embodiments of the present invention describe examples in which the present invention is applied to a laminated ceramic capacitor group that configures a decoupling circuit, preferred embodiments of the present invention can also be applied in a laminated ceramic capacitor group included in a circuit, used for other applications, that is connected to a line in which voltage variations containing audible frequency components (about 20 Hz to about 20 kHz) are present.

Further still, as described above, the present invention is not limited to being applied in a mounting structure for a laminated ceramic capacitor and a manufacturing method thereof as described in the aforementioned preferred embodiments of the present invention, and can be applied for other types of capacitor elements, such as laminated metalized film capacitors, and in manufacturing methods thereof.

Here, a case where a single capacitor element is replaced with two or more capacitor elements, the two or more capacitor elements are electrically connected in parallel, and preferred embodiments of the present invention is then applied to this configuration will be given as an example of a case in which preferred embodiments of the present invention are favorably applied. In this case, not only can vibrations produced in the wiring board be reduced by replacing the capacitor element with lower-capacity and smaller-size capacitor elements, but the vibrations in the wiring board can also be further reduced by the vibrations of cancelling-out, which is an effect of preferred embodiments of the present invention described above; this in turn makes it possible to greatly reduce noise. For example, by replacing a capacitor element whose capacity is about 10 μF with two capacitor elements whose capacities are about 4.7 μF each, noise is greatly reduced without greatly increasing the surface area used for mounting.

Meanwhile, although the foregoing has described in detail a circuit board serving as a mounting structure for a capacitor element according to the preferred embodiments of the present invention, a laminated ceramic capacitor mounting method according to the preferred embodiments of the present invention mounts a plurality of laminated ceramic capacitors on a wiring board so as to meet the laminated ceramic capacitor layout conditions described in the aforementioned first through eighth configuration examples based on the preferred embodiments of the present invention, where a first capacitor element and a second capacitor element are mounted on the wiring board so that a direction in which a pair of long sides on opposing main surfaces of the first capacitor element extend is perpendicular or substantially perpendicular to a direction in which a pair of long sides on opposing main surfaces of the second capacitor element extend and so that one of a pair of side surfaces of the first capacitor element opposes one of a pair of end surfaces of the second capacitor element.

By applying this laminated ceramic capacitor mounting method, vibrations produced in the wiring board are significantly reduced or prevented, and noise is significantly reduced or prevented without increasing the size of the electronic device as a result.

Furthermore, the characteristic configurations indicated in the aforementioned first to eighth configuration examples based on the preferred embodiments of the present invention can of course be combined with each other without departing from the essential spirit of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor element mounting structure comprising
a plurality of capacitor elements mounted on a wiring board, each of the plurality of capacitor elements including a multilayer body including dielectric material layers and internal electrode layers layered in an alternating manner along a predetermined direction; wherein
the plurality of capacitor elements include a first capacitor element and a second capacitor element, disposed near or adjacent to each other and arranged along a direction parallel or substantially parallel to a main surface of the wiring board, and electrically connected in series or in parallel via a conductive pattern provided on the wiring board;
a main surface of the first capacitor element and a main surface of the second capacitor element that oppose the wiring board both have a rectangular or substantially rectangular shape including a pair of short sides and a pair of long sides;
the first capacitor element and the second capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body; and
the first capacitor element and the second capacitor element are mounted on the wiring board so that a direction in which the pair of long sides of the main surface on the first capacitor element extend is perpendicular or substantially perpendicular to a direction in which the pair of long sides of the main surface on the second capacitor element extend and one of the pair of side surfaces on the first capacitor element opposes one of the pair of end surfaces on the second capacitor element.

2. The capacitor element mounting structure according to claim 1, wherein
each of the first capacitor element and the second capacitor element includes one of the pair of outer electrodes on one of the pair of end surfaces and the other of the pair of outer electrodes on the other of the pair of end surfaces; and
each of the outer electrodes is electrically connected, via a conductive joining member, to a land provided on the wiring board in correspondence with the outer electrode.

3. The capacitor element mounting structure according to claim 2, wherein each of the lands includes a portion that opposes the corresponding outer electrode along a normal direction of the main surface of the wiring board.

4. The capacitor element mounting structure according to claim 3, wherein each of a pair of lands electrically connected to the pair of outer electrodes of the first capacitor element via the joining members extends to outside of a corresponding one of the pair of end surfaces on the first capacitor element in the direction in which the pair of long sides of the main surface of the first capacitor element extend; and each of a pair of lands electrically connected to the pair of outer electrodes of the second capacitor element via the joining members extends to outside of a corresponding one of the pair of end surfaces on the second capacitor element in the direction in which the pair of long sides of the main surface of the second capacitor element extend.

5. The capacitor element mounting structure according to claim 4, wherein in a case where one of the pair of lands electrically connected to the pair of outer electrodes of the first capacitor element via the joining members is a first land and the other is a second land, a distance between an end portion of the first land on the side opposite from the second land and an end portion of the second land on the side opposite from the first land is D1, and a length of the first capacitor element along a direction in which the pair of long sides of the main surface on the first capacitor element extend is L1, the distance D1 is no less than about 1.1 times and no more than about 1.3 times the length L1; and in a case where one of the pair of lands electrically connected to the pair of outer electrodes of the second capacitor element via the joining members is a third land and the other is a fourth land, a distance between an end portion of the third land on the side opposite from the fourth land and an end portion of the fourth land on the side opposite from the third land is D2, and a length of the second capacitor element along a direction in which the pair of long sides of the main surface on the second capacitor element extend is L2, the distance D2 is no less than about 1.1 times and no more than about 1.3 times the length L2.

6. The capacitor element mounting structure according to claim 1, wherein each of the first capacitor element and the second capacitor element is mounted on the wiring board so that the direction in which the dielectric material layers and the internal electrode layers are layered in the multilayer body is parallel or substantially parallel to the normal direction of the main surface of the wiring board.

7. The capacitor element mounting structure according to claim 1, further comprising an integrated circuit element mounted on the wiring board, wherein a capacitor element group including the first capacitor element and the second capacitor element and the integrated circuit element are disposed near or adjacent to each other and arranged along a direction parallel or substantially parallel to the main surface of the wiring board.

8. The capacitor element mounting structure according to claim 1, wherein each of the plurality capacitor elements has a rectangular or substantially rectangular parallelepiped shape.

9. A capacitor element mounting structure comprising:

a plurality of capacitor elements mounted on a wiring board, each of the plurality of capacitor elements including a multilayer body including dielectric material layers and internal electrode layers layered in an alternating manner along a predetermined direction; wherein the plurality of capacitor elements include a first capacitor element, a second capacitor element, a third capacitor element, and a fourth capacitor element, disposed near or adjacent to each other and arranged along a direction parallel or substantially parallel to a main surface of the wiring board, and electrically connected in series or in parallel via a conductive pattern provided on the wiring board;

a main surface of the first capacitor element, a main surface of the second capacitor element, a main surface of the third capacitor element, and a main surface of the fourth capacitor element that oppose the wiring board all have a rectangular or substantially rectangular shape including a pair of short sides and a pair of long sides;

the first capacitor element, the second capacitor element, the third capacitor element, and the fourth capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body; and the first capacitor element, the second capacitor element, the third capacitor element, and the fourth capacitor element are mounted on the wiring board so that a direction in which the pair of long sides of the main surface on the first capacitor element extend is perpendicular or substantially perpendicular to a direction in which the pair of long sides of the main surface on the second capacitor element extend, a direction in which the pair of long sides of the main surface on the second capacitor element extend is perpendicular or substantially perpendicular to a direction in which the pair of long sides of the main surface on the third capacitor element extend, a direction in which the pair of long sides of the main surface on the third capacitor element extend is perpendicular or substantially perpendicular to a direction in which the pair of long sides of the main surface on the fourth capacitor element extend, and a direction in which the pair of long sides of the main surface on the fourth capacitor element extend is perpendicular or substantially perpendicular to a direction in which the pair of long sides of the main surface on the first capacitor element extend, and so that one of the pair of side surfaces on the first capacitor element opposes one of the pair of end surfaces on the second capacitor element, one of the pair of side surfaces on the second capacitor element opposes one of the pair of end surfaces on the third capacitor element, one of the pair of side surfaces on the third capacitor element opposes one of the pair of end surfaces on the fourth capacitor element, and one of the pair of side surfaces on the fourth capacitor element opposes one of the pair of end surfaces on the first capacitor element.

10. The capacitor element mounting structure according to claim 9, wherein each of the plurality capacitor elements has a rectangular or substantially rectangular parallelepiped shape.

11. The capacitor element mounting structure according to claim 9, further comprising an integrated circuit element mounted on the wiring board; wherein a capacitor element group including the first capacitor element, the second capacitor element, the third capacitor element, and the fourth capacitor element and the integrated circuit element are disposed near or adjacent to each other and arranged along a direction parallel or substantially parallel to the main surface of the wiring board.

12. The capacitor element mounting structure according to claim 9, wherein each of the plurality capacitor elements has a rectangular or substantially rectangular parallelepiped shape.

13. A capacitor element mounting method for mounting a plurality of capacitor elements on a wiring board, each of the plurality of capacitor elements including a multilayer body including dielectric material layers and internal electrode layers layered in an alternating manner along a predetermined direction, the method comprising:
- mounting the plurality of capacitor elements that include a first capacitor element and a second capacitor element, disposed near or adjacent to each other and arranged along a direction parallel or substantially parallel to a main surface of the wiring board, and electrically connected in series or in parallel via a conductive pattern provided on the wiring board; wherein
- a main surface of the first capacitor element and a main surface of the second capacitor element that oppose the wiring board both are rectangular or substantially rectangular and include a pair of short sides and a pair of long sides;
- the first capacitor element and the second capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body; and
- the first capacitor element and the second capacitor element are mounted on the wiring board so that a direction in which the pair of long sides of the main surface on the first capacitor element extend is perpendicular or substantially perpendicular to a direction in which the pair of long sides of the main surface on the second capacitor element extend and one of the pair of side surfaces on the first capacitor element opposes one of the pair of end surfaces on the second capacitor element.

14. The method according to claim 13, wherein each of the plurality capacitor elements has a rectangular or substantially rectangular parallelepiped shape.

15. The method according to claim 13, wherein
- each of the first capacitor element and the second capacitor element includes one of the pair of outer electrodes on one of the pair of end surfaces and the other of the pair of outer electrodes on the other of the pair of end surfaces; and
- each of the outer electrodes is electrically connected, via a conductive joining member, to a land provided on the wiring board in correspondence with the outer electrode.

16. The method according to claim 15, wherein each of the lands includes a portion that opposes the corresponding outer electrode along a normal direction of the main surface of the wiring board.

17. The method according to claim 16, wherein
- each of a pair of lands electrically connected to the pair of outer electrodes of the first capacitor element via the joining members extends to outside of a corresponding one of the pair of end surfaces on the first capacitor element in the direction in which the pair of long sides of the main surface of the first capacitor element extend; and
- each of a pair of lands electrically connected to the pair of outer electrodes of the second capacitor element via the joining members extends to outside of a corresponding one of the pair of end surfaces on the second capacitor element in the direction in which the pair of long sides of the main surface of the second capacitor element extend.

18. The method according to claim 17, wherein
- in a case where one of the pair of lands electrically connected to the pair of outer electrodes of the first capacitor element via the joining members is a first land and the other is a second land, a distance between an end portion of the first land on the side opposite from the second land and an end portion of the second land on the side opposite from the first land is D1, and a length of the first capacitor element along a direction in which the pair of long sides of the main surface on the first capacitor element extend is L1, the distance D1 is no less than about 1.1 times and no more than about 1.3 times the length L1; and
- in a case where one of the pair of lands electrically connected to the pair of outer electrodes of the second capacitor element via the joining members is a third land and the other is a fourth land, a distance between an end portion of the third land on the side opposite from the fourth land and an end portion of the fourth land on the side opposite from the third land is D2, and a length of the second capacitor element along a direction in which the pair of long sides of the main surface on the second capacitor element extend is L2, the distance D2 is no less than about 1.1 times and no more than about 1.3 times the length L2.

19. A capacitor element mounting method for mounting a plurality of capacitor elements on a wiring board, each of the plurality of capacitor elements including a multilayer body including dielectric material layers and internal electrode layers layered in an alternating manner along a predetermined direction, the method comprising:
- mounting the plurality of capacitor elements that include a first capacitor element, a second capacitor element, a third capacitor element, and a fourth capacitor element, disposed near or adjacent to each other and arranged along a direction parallel or substantially parallel to a main surface of the wiring board, and electrically connected in series or in parallel via a conductive pattern provided on the wiring board; wherein
- a main surface of the first capacitor element, a main surface of the second capacitor element, a main surface of the third capacitor element, and a main surface of the fourth capacitor element that oppose the wiring board are all rectangular or substantially rectangular and include a pair of short sides and a pair of long sides;
- the first capacitor element, the second capacitor element, the third capacitor element, and the fourth capacitor element each include a pair of end surfaces located opposite to each other on both ends in a direction in which the pair of long sides extend, a pair of side surfaces located opposite to each other on both ends in a direction in which the pair of short sides extend, and a pair of outer electrodes provided distanced from each other on an outer surface of the multilayer body; and
- the first capacitor element, the second capacitor element, the third capacitor element, and the fourth capacitor element are mounted on the wiring board so that a direction in which the pair of long sides of the main surface on the first capacitor element extend is perpendicular or substantially perpendicular to a direction in which the pair of long sides of the main surface on the second capacitor element extend, the direction in which the pair of long sides of the main surface on the second capacitor element extend is perpendicular or substantially perpendicular to a direction in which the pair of long sides of the main surface on the third capacitor element extend, the direction in which the pair of long sides of the main surface on the third capacitor element extend is perpendicular or substantially perpendicular to a direction in which the pair of long sides of the main surface on the fourth capacitor element extend, and the direction in which the pair of long sides of the main surface on the fourth capacitor element extend is perpendicular or substantially perpendicular to the direction in which the pair of long sides of the main surface on the first capacitor element extend, and so that one of the pair of side surfaces on the first capacitor element opposes one of the pair of end surfaces on the second capacitor element, one of the pair of side surfaces on the second capacitor element opposes one of the pair of end surfaces on the third capacitor element, one of the pair of side surfaces on the third capacitor element opposes one of the pair of end surfaces on the fourth capacitor element, and one of the pair of side surfaces on the fourth capacitor element opposes one of the pair of end surfaces on the first capacitor element.

20. The method according to claim 19, wherein each of the plurality capacitor elements has a rectangular or substantially rectangular parallelepiped shape.

\* \* \* \* \*